(12) United States Patent
McDaniel

(10) Patent No.: US 10,747,915 B2
(45) Date of Patent: Aug. 18, 2020

(54) PROGRAMMING AUTOMATION SENSOR APPLICATIONS USING SIMULATION

(71) Applicant: Siemens Aktiengesellschaft, Munich (DE)

(72) Inventor: Richard Gary McDaniel, Hightstown, NJ (US)

(73) Assignee: Siemens Aktiengesellschaft, Munich (DE)

(*) Notice: Subject to any disclaimer, the term of this patent is extended or adjusted under 35 U.S.C. 154(b) by 555 days.

(21) Appl. No.: 14/829,341

(22) Filed: Aug. 18, 2015

(65) Prior Publication Data

US 2017/0053047 A1 Feb. 23, 2017

(51) Int. Cl.
*G06F 30/20* (2020.01)
*G05B 17/02* (2006.01)

(52) U.S. Cl.
CPC .............. *G06F 30/20* (2020.01); *G05B 17/02* (2013.01)

(58) Field of Classification Search
CPC ..... G05B 17/02; G06F 17/5009; G06F 30/17; G06F 30/20
See application file for complete search history.

(56) References Cited

U.S. PATENT DOCUMENTS

| 8,239,840 B1* | 8/2012 | Czymontek | G06F 8/34 717/125 |
| 8,417,490 B1* | 4/2013 | Preston | G06F 17/5095 701/114 |
| 2010/0163627 A1* | 7/2010 | Olmstead | G06K 7/10702 235/470 |
| 2013/0076522 A1* | 3/2013 | Csaszar | G06K 7/0008 340/686.1 |

* cited by examiner

*Primary Examiner* — Aniss Chad

(57) ABSTRACT

A computer-implemented method of simulating automation applications based on input from a user includes a computer creating a system design in a three-dimensional workspace based on one or more instructions provided by the user. The system design comprises a sensor component representative of a physical sensor controlled by a physical controller, and one or more detectable components representative of objects detectable by the physical sensor. The computer assigns a tag value to each of the one or more detectable components and executes a simulation of the system design in response to a command from the user. The sensor component simulates detection of the one or more detectable components using the tag value assigned to each respective detectable component.

18 Claims, 23 Drawing Sheets

PROGRAMMING AUTOMATION SENSOR APPLICATIONS USING SIMULATION

TECHNICAL FIELD

The present invention relates generally to methods, systems, and apparatuses for programming automation systems using a three-dimensional graphical engineering tool which employs tightly coupled logic and physical simulation techniques. The technology described herein may be applied, for example, to simulate the operation of automation sensors and to use that simulation to generate executable code for such sensors.

BACKGROUND

Programming an automation system is a complex task due to dynamic nature of the system. The developer must know what the consequences of the various programming elements will be in their proper context. In conventional systems, the programmer has to keep this knowledge in his or her head. Simulation tools may be used to help developers make educated guesses regarding runtime operations. However, transfer of knowledge gained through simulation to the real-world environment is difficult and error-prone. Thus, it is desired to provide a system which allows developers to create logic within the context of a simulated environment which may be transferred directly between the simulation and real-world environment.

One challenging aspect of providing a link between simulation and real-world automation environments is determining the degree to which real-world behavior is simulated. In principle, the entire real-world environment could be simulated; however, such a simulation would be time-intensive to create and costly to operate. It is therefore advantageous to have the simulation for more complicated elements to be programmed a priori by experts. One particular item that is challenging to incorporate into automation applications is a visual sensor (e.g., a camera). Such sensors typically include complex hardware and software to perform image detection and processing. Using conventional techniques, a detailed simulation of applications using this kind of hardware and software would require advanced graphical programming in order to test even the most basic sensor processing algorithms. Normally, simulation would not be attempted and all testing of automation code would be done on actual hardware. Thus, it is desired to provide a more convenient way of developing vision sensor applications within simulated automation that is tightly coupled to its real-world counterpart so that automation logic programmed in simulation can run in the real world.

SUMMARY

Embodiments of the present invention address and overcome one or more of the above shortcomings and drawbacks, by providing methods, systems, and apparatuses for programming automation in a three-dimensional graphical interface using physical simulation. The technology disclosed herein may be used, for example, to design, simulate, and implement various industrial environments and machinery.

Briefly, various embodiments of the present invention describe a graphical simulation environment where logical and physical components reside in the same workspace and can be edited, modified, and executed in an ad hoc manner. For example, in one embodiment, simulation can be run at any point during the design process—even if the design is incomplete or results in failure. Logic may be used to modify the state of components as well as create new components, for example, to represent work items that may interact with other components. For example, in some embodiments, special logic blocks referred to as a "tags" and "tag sensors" are used. Tags can be used, for example, to create new application state such as marking components and to shuttle information in values across circuits in the application logic. They can also be used to simulate how advanced sensors like vision recognize objects. A vision algorithm can use tags to detect the properties of the objects it is supposed to recognize and objects can be tagged to show what objects a vision sensor can detect. This allows a simulated vision algorithm to exhibit the behaviors of a vision sensor in the physical automation environment and so that logic developed in simulation will also work with the real sensor.

According to some embodiments, a computer-implemented method of simulating automation applications based on input from a user includes a computer creating a system design in a three-dimensional workspace based on one or more instructions provided by the user. The system design comprises a sensor component representative of a physical sensor controlled by a physical controller, and one or more detectable components representative of objects detectable by the physical sensor. The computer assigns a tag value to each of the one or more detectable components and executes a simulation of the system design in response to a command from the user. The sensor component simulates detection of the one or more detectable components using the tag value assigned to each respective detectable component.

The aforementioned method may have additional features, refinements, or other modifications made in different embodiments of the present invention. For example, in some embodiments, the computer generates controller-executable code for the physical controller based on the system design. In some embodiments, the tag value comprises a visually detectable property such as, for example, a color value or a barcode value. In some embodiments, the tag value is assigned to each of the one or more detectable components during the execution of the simulation of the system design using a dynamically generated tag object.

The aforementioned method may also comprise a calibration process performed prior to executing the simulation of the system design. A sensor input interface comprising a sensor image showing a field of view of the sensor component is presented, for example, to a user. One or more user-specified locations within the field of view are received via the sensor input interface. Then, the sensor component is configured to detect the one or more detectable components when located at the one or more user-specified locations. In some embodiments, the sensor image in the sensor input interface comprises a real-time video stream received from the physical sensor using the network interface. In some embodiments, during execution of the simulation code, a first detectable component is identified at one of the one or more user-specified locations. A first tag value associated with the first detectable component may then be identified and the first tag value may be used to simulate detection of the first detectable component.

According to other embodiments of the present invention, an article of manufacture for simulating automation applications based on input from a user comprises a non-transitory, tangible computer-readable medium holding computer-executable instructions for performing the aforementioned method, with or without the additional features discussed above.

According to other embodiments of the present invention, a system for designing automation applications based on input from a user includes a workspace configured to allow user creation and manipulation of a three-dimensional model of an industrial environment, a simulation engine, and a network interface. The workspace is configured to allow user creation and manipulation of a three-dimensional model of an industrial environment. This three-dimensional model comprises a sensor component representative of a physical sensor (e.g., a QR code reader or a color checking device) controlled by a physical controller in the industrial environment, one or more detectable components representative of physical objects detectable by the physical sensor in the industrial environment, and a tag value assigned to each of the one or more detectable components which is representative of one or more visually detectable properties associated with the physical objects. The simulation engine is configured to generate simulation code which uses the sensor component and the tag value assigned to each of the one or more detectable components to simulate detection of the physical objects by the physical sensor, and execute the simulation code in response to a command from the user. The network interface facilitates transfer of data between the system and the industrial environment.

The aforementioned system may have additional features, refinements, or other modifications made in different embodiments of the present invention. For example, in some embodiments, the system further comprises a controller code generation unit configured to generate controller-executable code for the physical controller based on the simulation code. This controller code generation unit may also be configured to send the controller-executable code to the physical controller using the network interface. In some embodiments of the aforementioned system, the workspace is further configured to perform a calibration process similar to that described with respect to the methods discussed above.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there are shown in the drawings embodiments that are presently preferred, it being understood, however, that the invention is not limited to the specific detailed description.

DETAILED DESCRIPTION

The following disclosure describes the present invention according to several embodiments directed at methods, systems, and apparatuses for programming automation in a graphical engineering tool with tightly coupled logic and physical simulation. The various embodiments of the present invention described herein incorporate simulation and control programming together in the same tool such that they are co-mingled and no longer separate practices. Thus, in some embodiments, the engineering tool may be directly linked to the runtime environment such that live data (e.g., images captured by system cameras) can be directly used in the simulation and control programming. Additionally, in some embodiments, the engineering tool provides logic blocks referred to herein as "tags" and "tag sensors" for integrating the engineering tool's programming and simulation language with the simulated components. Using these tags, various properties can be set for simulation objects which, in turn, help to ease the integration of real-world information into the simulation. The technology described herein is especially applicable, but not limited to, system design and implementation in industrial applications.

Figure 1:
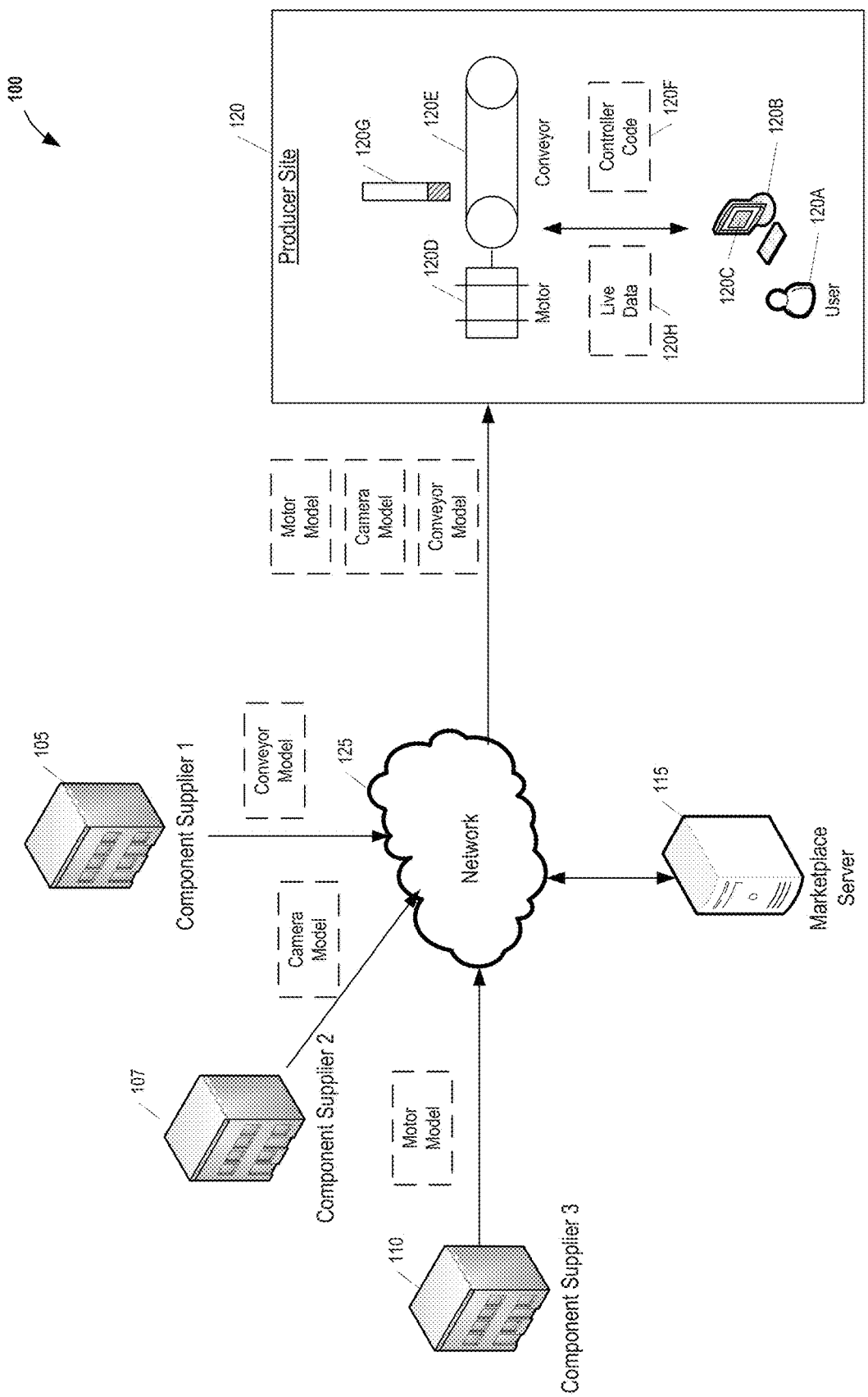
FIG. 1 provides an overview of a system for programming automation, according to some embodiments of the present invention.

FIG. 1 provides an overview of a simulation environment 100 for programming automation, according to some embodiments of the present invention. Briefly, Component Suppliers 105, 107, and 110 supply device models to a Marketplace Server 115 via a Network 125. A User 120A at a Producer Site 120 can then download these models from the Marketplace Server 115 via the Network 125 for use in a graphical engineering tool executed on User Computer 120B. The User Computer 120B allows the User 120A to generate Controller Code 120F which can then be uploaded to controllers associated with physical devices 120D, 120E, and 120G.

Component Suppliers 105, 107, and 110 provide models for a physical conveyor, a camera sensor, and a motor, respectively, to the Marketplace Server 115 via a Network 125. Each model provides detailed information about the device using a standardized language such as Extensible Markup Language (XML). Models may be designed to be functionally self-contained and as intelligent as needed. Models may represent a physical device such as a sensor or actuator, a controlling device such as a programmable logic controller, a work piece such as parts to be machined or assembled, and may represent functions that can be applied in the application with no physical substance. The contents of the model may include, for example, detailed information about the geometry, kinematics, and behavior of the corresponding physical device. Models may also include indications for interfacing with other models and well as providing different configurations. Computer-aided design software extensions may be used to generate models by incorporating mechanical designs. The Marketplace Server 115 hosts a repository for models generated by component suppliers. The Marketplace Server 115 provides an interface to the repository which allows users to browse and download models. For example, in some embodiments, the Marketplace Server 115 uses a webpage interface which provides a catalog of the various models available for download. The interface may include detailed information regarding each model including, for example, an image of the modeled physical device, a listing of input and output ports, configurable properties, and a description of model behavior that may be in an executable format. In some embodiments, the Marketplace Server 115 can also handle transactions between users and the various component suppliers. For example, in one embodiment, the user is charged a fee for each model downloaded from the Marketplace Server 115. In another embodiment, the Marketplace Server 115 facilitates a transaction between the user and the component supplier to purchase a physical device corresponding to a particular model.

At the Producer Site 120, the User 120A utilizes User Computer 120B to execute an Engineering Tool 120C which allows the User 120A to download the motor model and conveyor model to User Computer 120B. The Engineering Tool 120C may then use the downloaded models in a simulation environment which performs computations that mimic the physical activities of the modeled items. Briefly, the Engineering Tool comprises a dynamics simulation engine that is embedded within a 3D graphical editor and visualization environment. The simulation engine is configured to simulate the physical activity of hardware devices and the work products that the devices manipulate and transform. The physical objects being simulated may be representative of actual hardware devices. The simulation for a given device is formulated to match the behavior of that device and to perform the same actions under the same input conditions within the capability of the simulation. The simulation may track the geometric shape, position, kinematic linkages, and dynamics of the objects. The simulation may compute the internal state and logical activity of the objects such as electrical or programmatic activity. The simulation may also include the ability to add and remove objects from the simulation dynamically. This ability can be used to simulate the transformation of objects such as cutting, crushing, and shaping. It may also be used to simulate the introduction and removing of work products from the process.

By simulating an industrial environment, the User 120A can easily identify the necessary physical components and layout needed to enable a particular process. Once the layout has been determined, the Engineering Tool 120C can generate additional details (e.g., a parts list and/or blueprint) so that the necessary physical components can be ordered (if they have not been purchased already) and configured in the desired layout. Additionally, in some embodiments, the Engineering Tool 120C generates controller code that may be used directly on physical components such as programmable logic controllers. The generated code may also be deployed directly on the physical component itself for components that have this capability. For example, in FIG. 1, the Engineering Tool can generate Controller Code 120F that may be utilized directly on the controllers associated with Physical Motor 120D, Physical Conveyor 120E, and Physical Camera 120G. Thus, installation of the physical devices is streamlined since the Controller Code 120F is ready for use soon after the design is completed. Additionally, the Engineering Tool 120C can directly integrate Live Data 120H from the simulation environment. For example, live video captured by Physical Camera 120G may be used to calibrate the operation of one or more components in the simulation.

Additional detail on the Engineering Tool discussed herein, as well as its application to various simulation scenarios is provided in PCT Patent Application No. PCT/US14/58769, filed Oct. 2, 2014 and entitled "Programming Automation in a 3D Graphical Editor with Tightly Coupled Logic and Physical Simulation," the entirety of which is incorporated herein by reference.

FIGS. 2A-2E provide a detailed visualization of the operation of a machine that may be used in an automation environment. This machine serves as an example in this application to illustrate how such a machine may be developed with an engineering tool which provides various simulation capabilities. However, it should be noted that the general concepts discussed throughout this disclosure are not limited to any particular machine, device, or system.

Figure 2A:
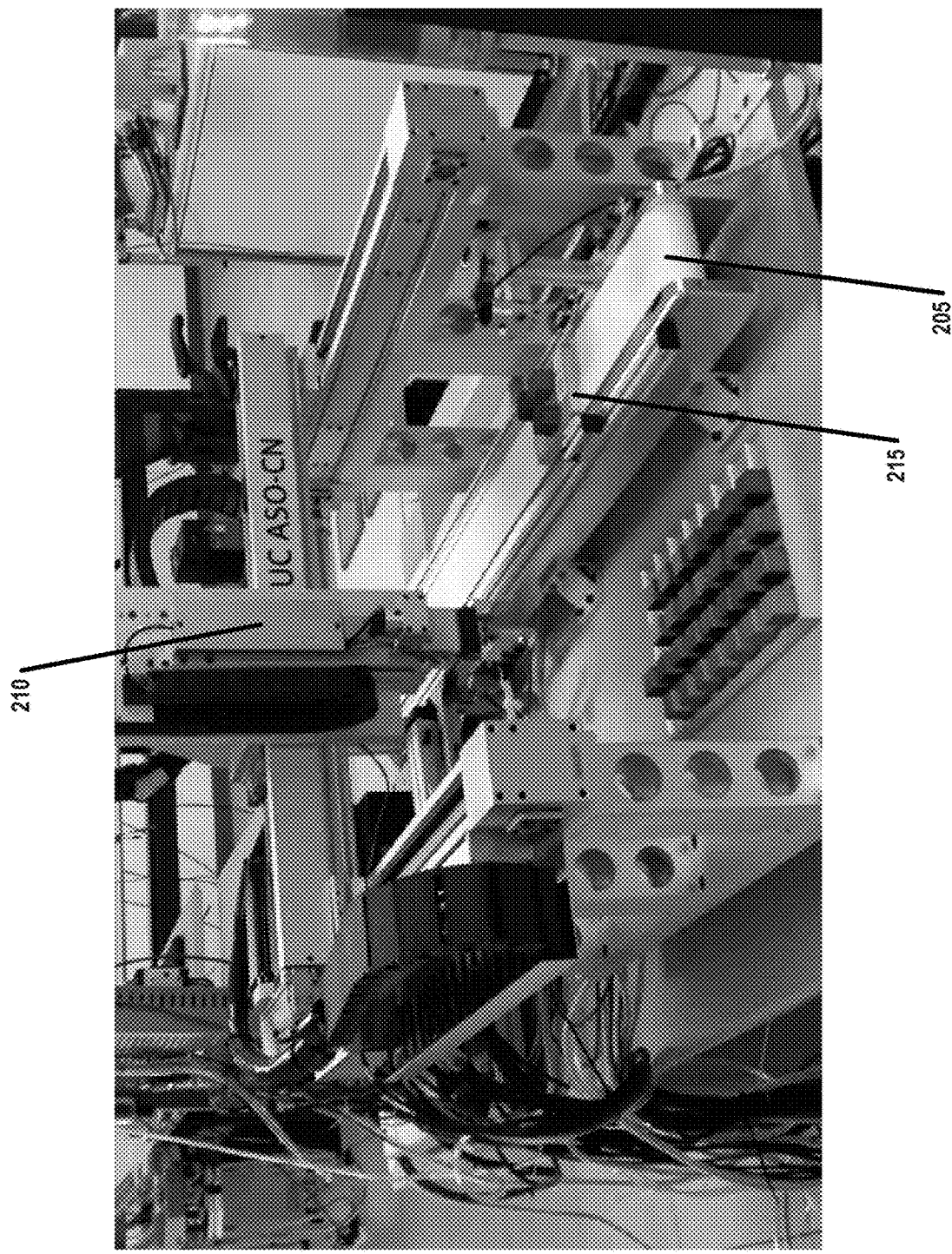
FIG. 2A shows a photograph of an example physical automation system.
Figure 2B:
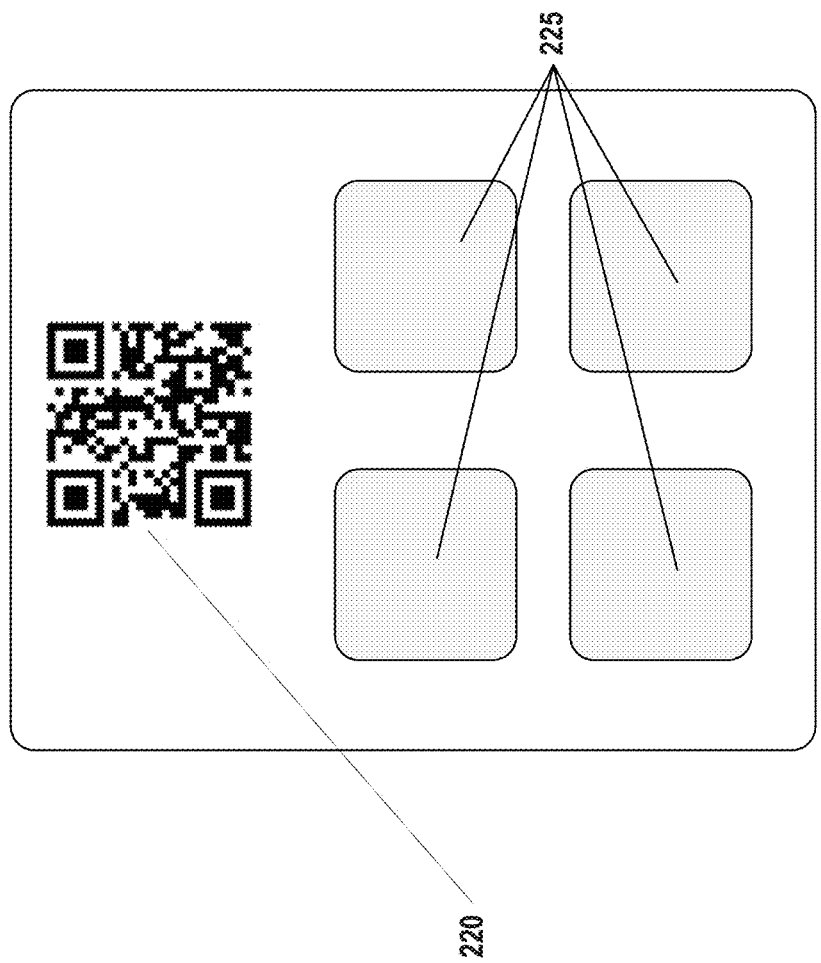
FIG. 2B provides an illustration of trays that may be used in the example presented in FIG. 2A.

FIG. 2A shows a photograph of an example physical automation system. This example combines three-axis gantry 210 and a conveyor belt 205 to perform selection and sorting functions. The task of this device is to fill trays (e.g., tray 215) with colored blocks according to the customer orders. FIG. 2B provides an illustration of trays that may be used in such a device. In this example, a printed QR code label 220 is used for identifying the tray. The tray in FIG. 2B includes four slots 225 in the tray for receiving blocks. A user can select which colored blocks go in which slot in each tray and provide such order information via a graphical user interface for configuring the device. Alternatively, the correspondence between color and slot may be based on one or more pre-set default values.

Figure 2C:
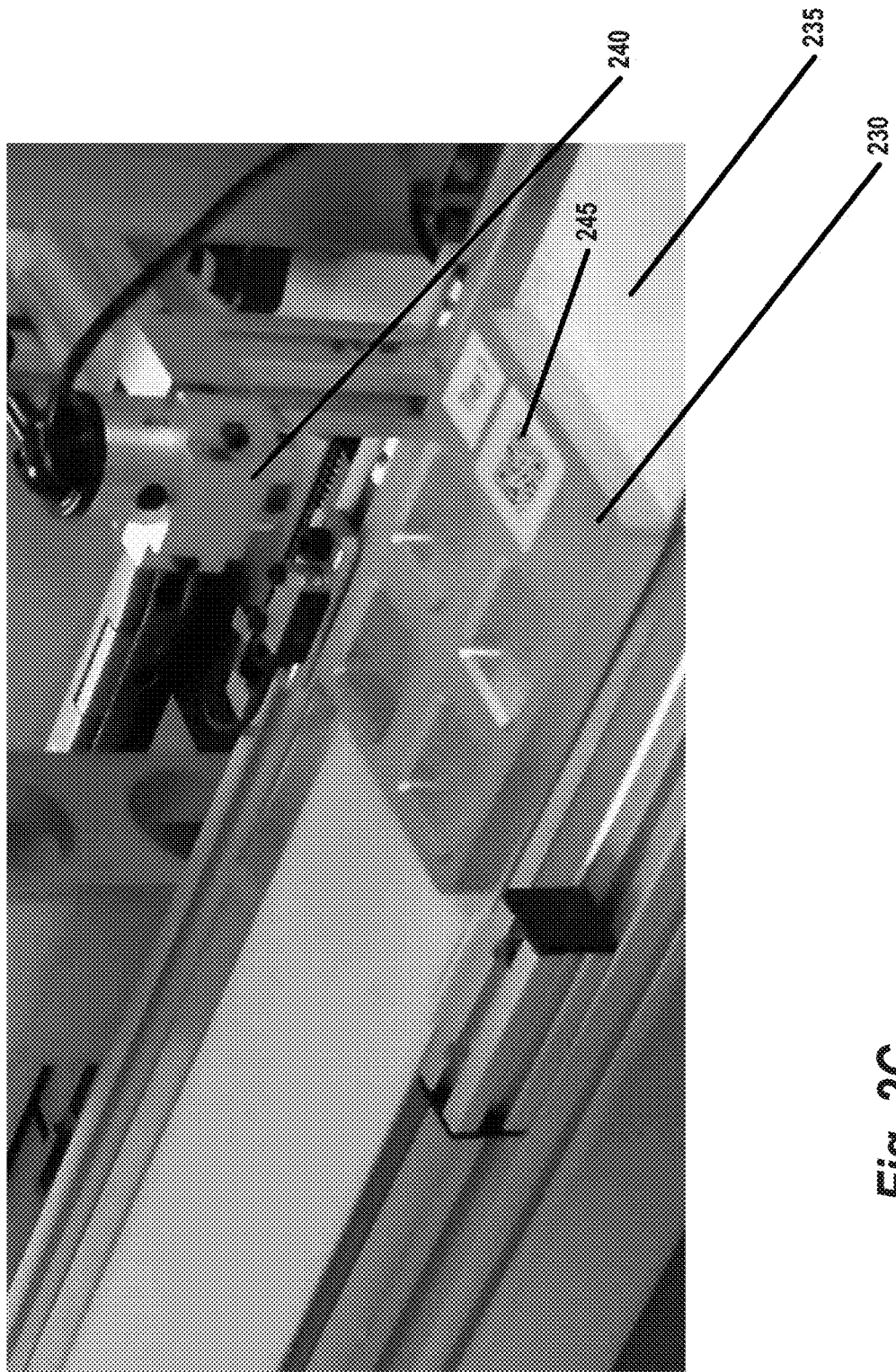
FIG. 2C shows a tray at the start of a selection and sorting process.
Figure 2D:
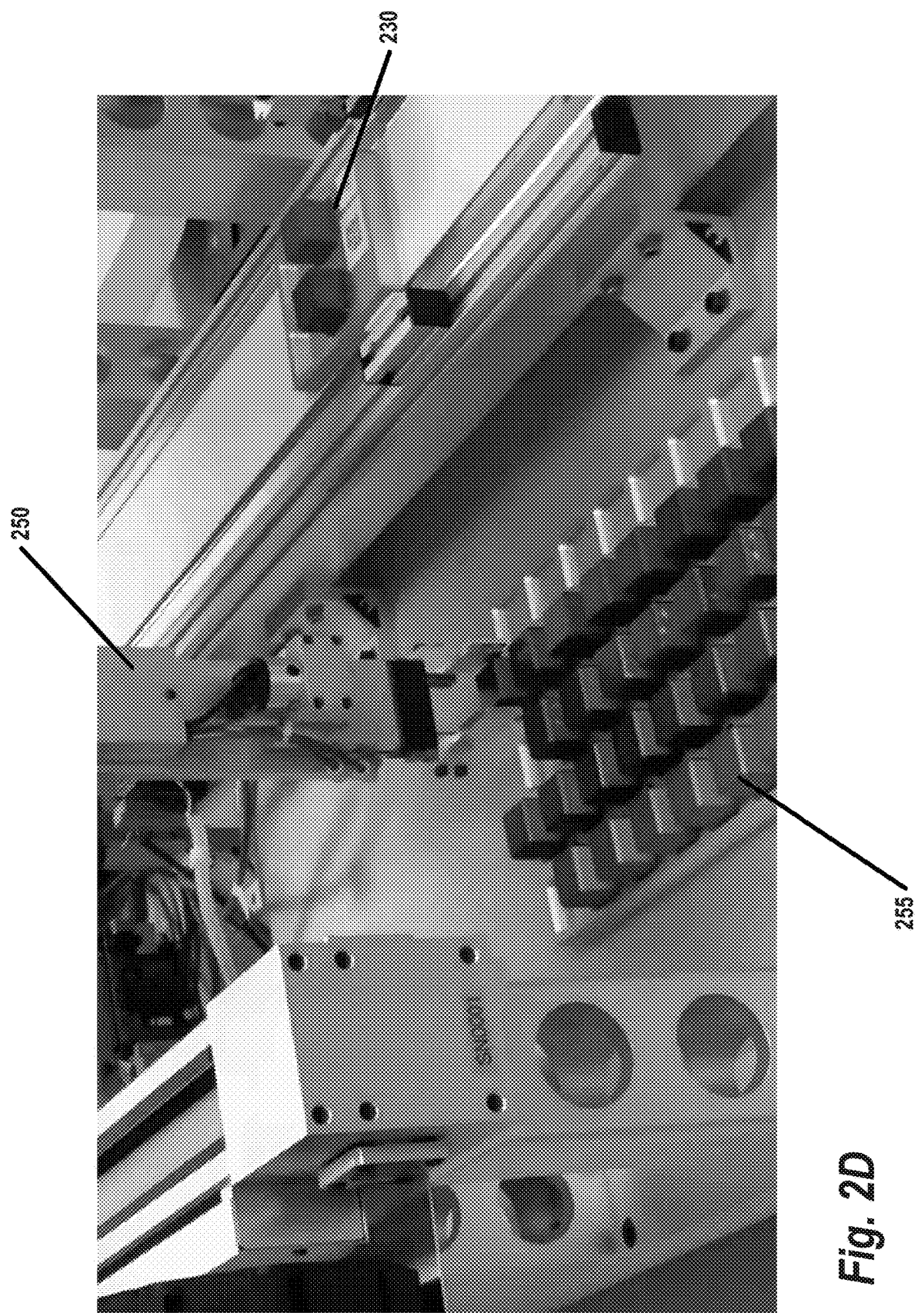
FIG. 2D shows a tray positioned in the middle of the machine while the gantry picks out blocks and puts them into the tray one at a time.
Figure 2E:
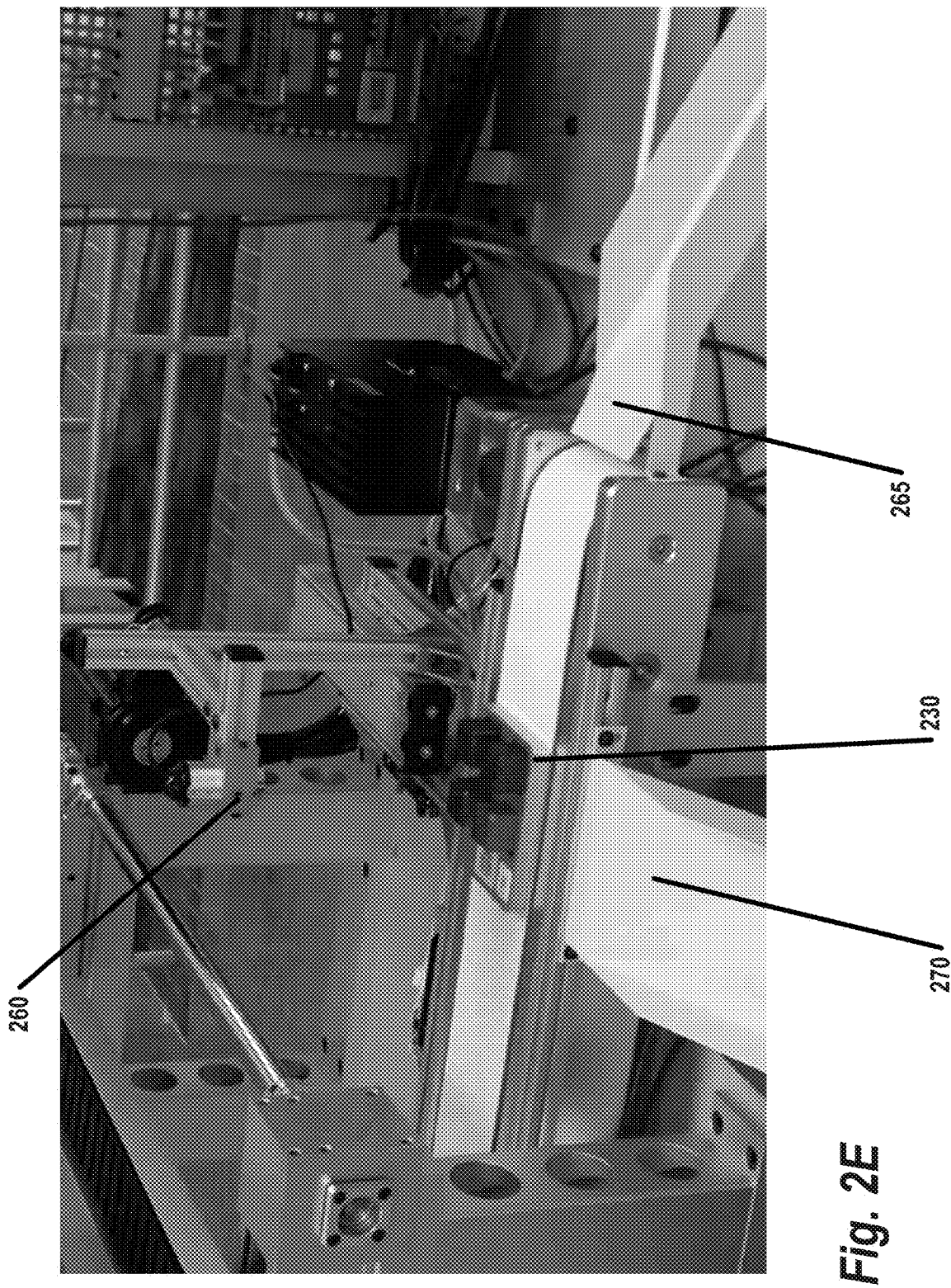
FIG. 2E illustrates an inspection camera scanning the blocks shown in FIG. 2D.

FIG. 2C shows a tray 230 at the start of the selection and sorting process. The tray 230 is placed at the head of the conveyor 235 to start the process. A reflection based presence sensor detects the tray 230. A camera 240 at the head of the conveyor 235 detects the QR code 245 so that the machine knows which tray is on the line. FIG. 2D shows the tray positioned in the middle of the machine while the gantry 250 picks out blocks 255 and places them into the tray 230 one at a time. A laser light barrier may be used to get an accurate initial position for the tray 230. Then, position-based control is used on the conveyor put the tray 230 into different locations. FIG. 2E shows the next step in the process. After the blocks are picked the tray 230 is brought to the inspection camera 260. The inspection camera 260 looks at the block colors in each tray position. If the colors match in values from the order information, the tray 240 is allowed to pass through to the output slide 265. If there is a mistake, the machine activates an automatic pusher and knocks the tray out to a reject slide 270.

Figure 3A:
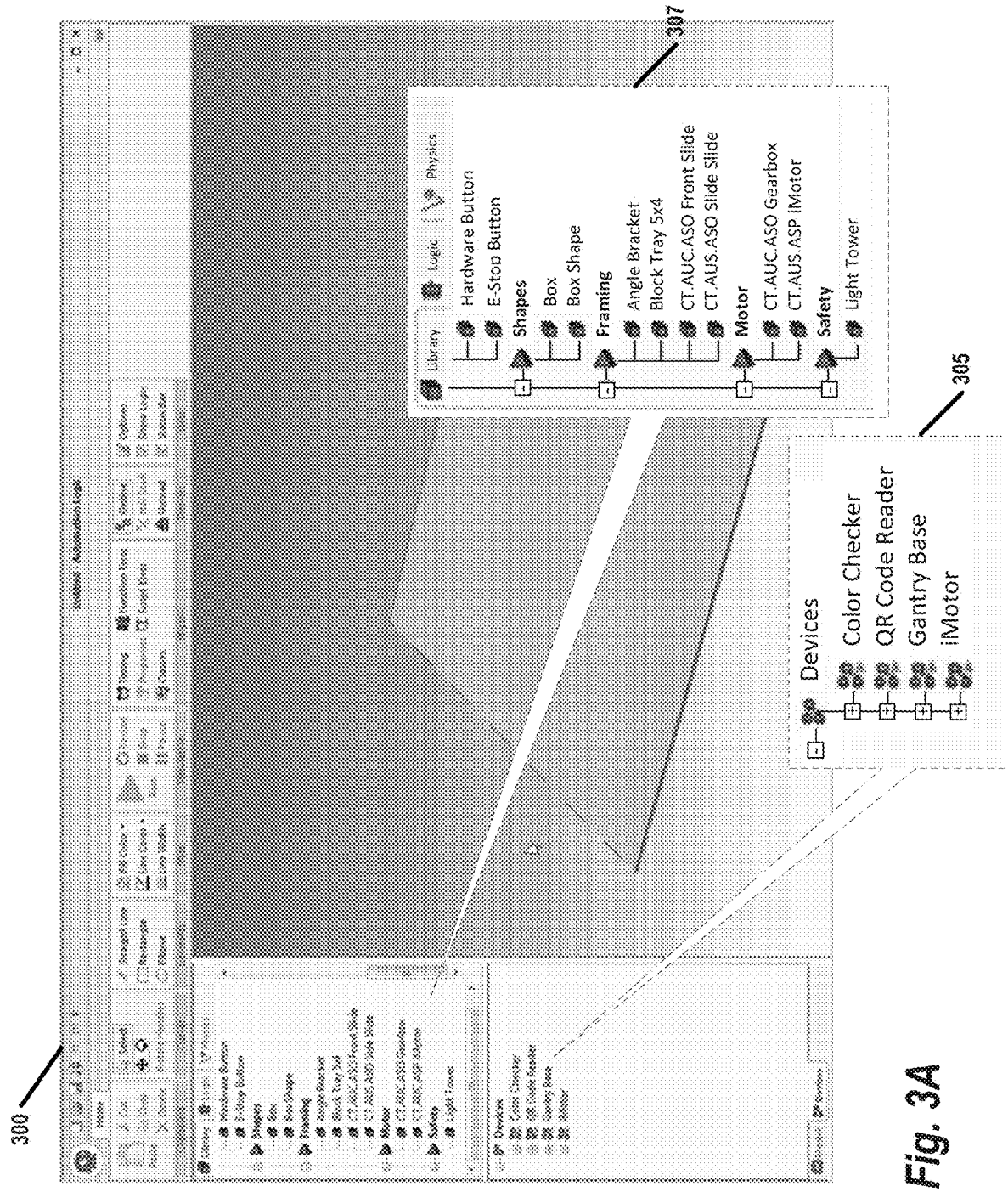
FIG. 3A shows a graphical user interface of an engineering tool that may be utilized in some embodiments.

FIGS. 3A-3E illustrate the software program that operates the machine shown in FIGS. 2A-2E. FIG. 3A shows a graphical user interface 300 of an engineering tool that may be utilized in some embodiments. The engineering tool may be connected to the machine's network using any technique known in the art. For example, in some embodiments, the engineering tool may auto-detect devices connected to the local network (shown in Callout 305). In other embodiments, a list of device is retrieved from an external system (e.g., MES) or it may be manually input by a user through the engineering tool itself.

A portion of the graphical user interface 300 presents all of the available devices connected to the network of the engineering tool. In this example, there are four devices: a color checker, a QR code reader, a gantry base, and an iMotor. One or more of the devices may contain embedded controllers within the automation system and may be used to execute software which provides instructions to the device. In principle, these controllers would be part of the physical devices themselves such as using the microchips that are already part of the camera devices. The devices may contain application instructions already loaded into their controllers. The user can pick one of the controllers and upload the application back into the engineering tool. The engineering tool then may be used for viewing and manipulating the device software.

Figure 3B:
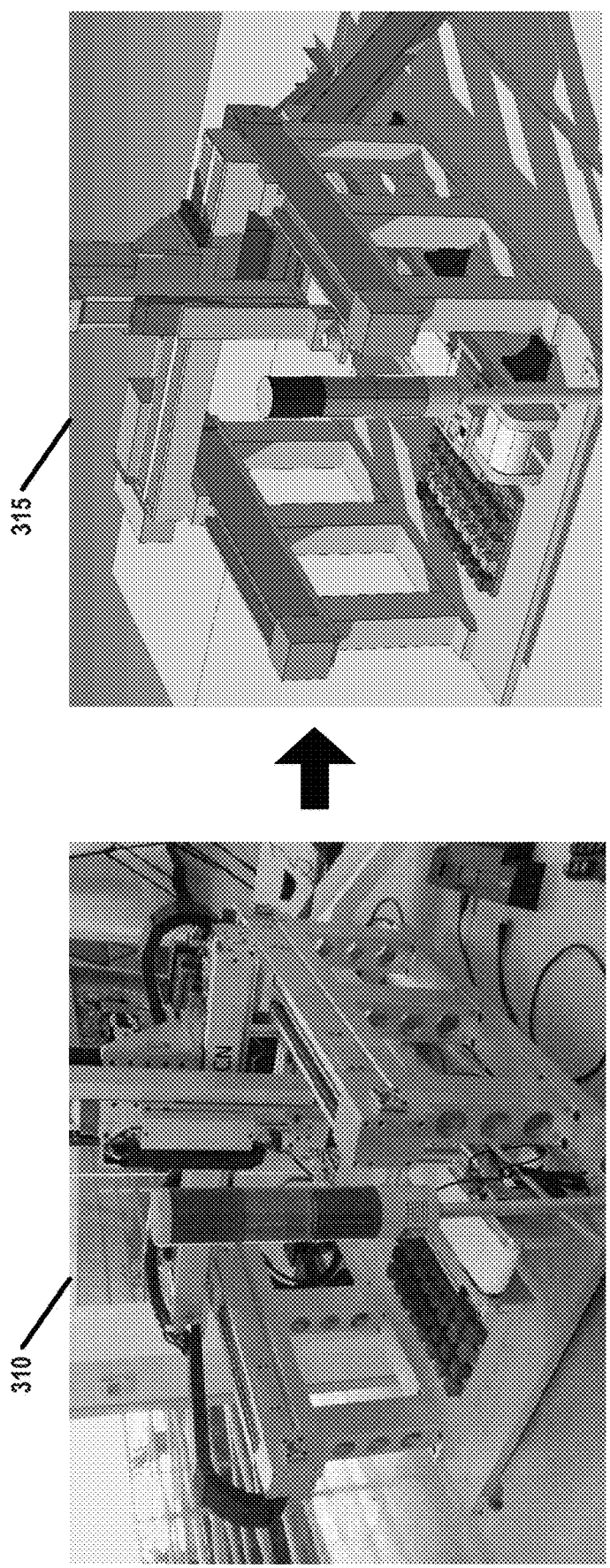
FIG. 3B shows a conceptual representation of how the physical system may be represented by a virtual system, according to some embodiments.
Figure 3C:
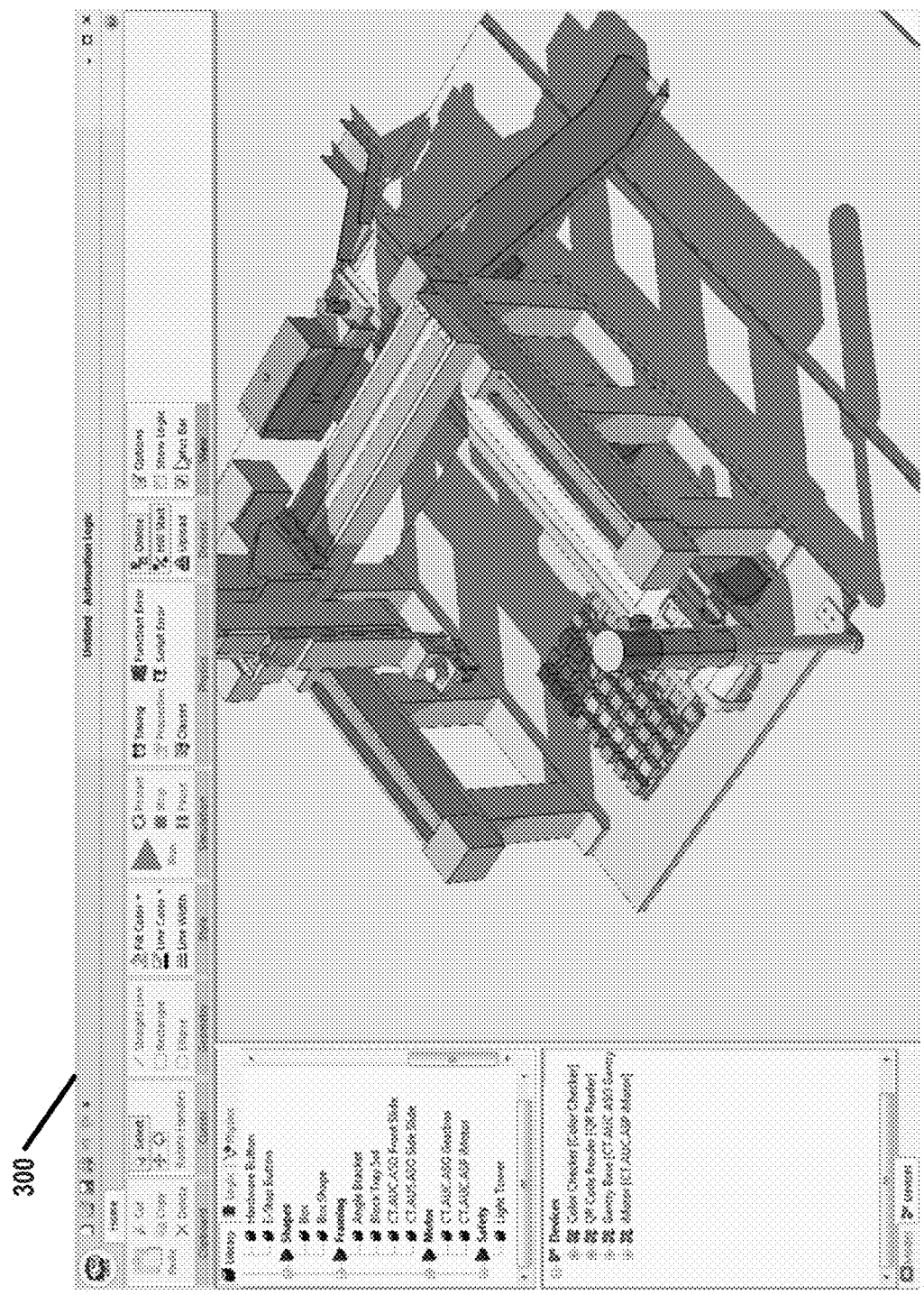
FIG. 3C shows the graphical user interface after the devices have been loaded.

Once the devices are known, they may be represented in the engineering tool. FIG. 3B shows a conceptual representation of how the physical system (shown in image 310) may be programmed using a virtual representation (shown in image 315). FIG. 3C shows the graphical user interface 300 after the devices' instructions have been loaded. Note that in FIGS. 3B and 3C, the program that controls the machine can look strikingly similar to the physical machine itself. It should also be noted that the engineering tool here is not necessarily providing a separate simulation of the machine or just the mechanical CAD layout. Rather, the engineering tool can be used to create the actual source code of the software that is running the application for the physical machine. The software that runs the machine can be composed from the components that look and act like the machine plus additional behavior. The user may generate the components from pre-existing CAD data or may compose the components using the 3D editor and creating objects from the component menu (Callout 307).

Figure 3D:
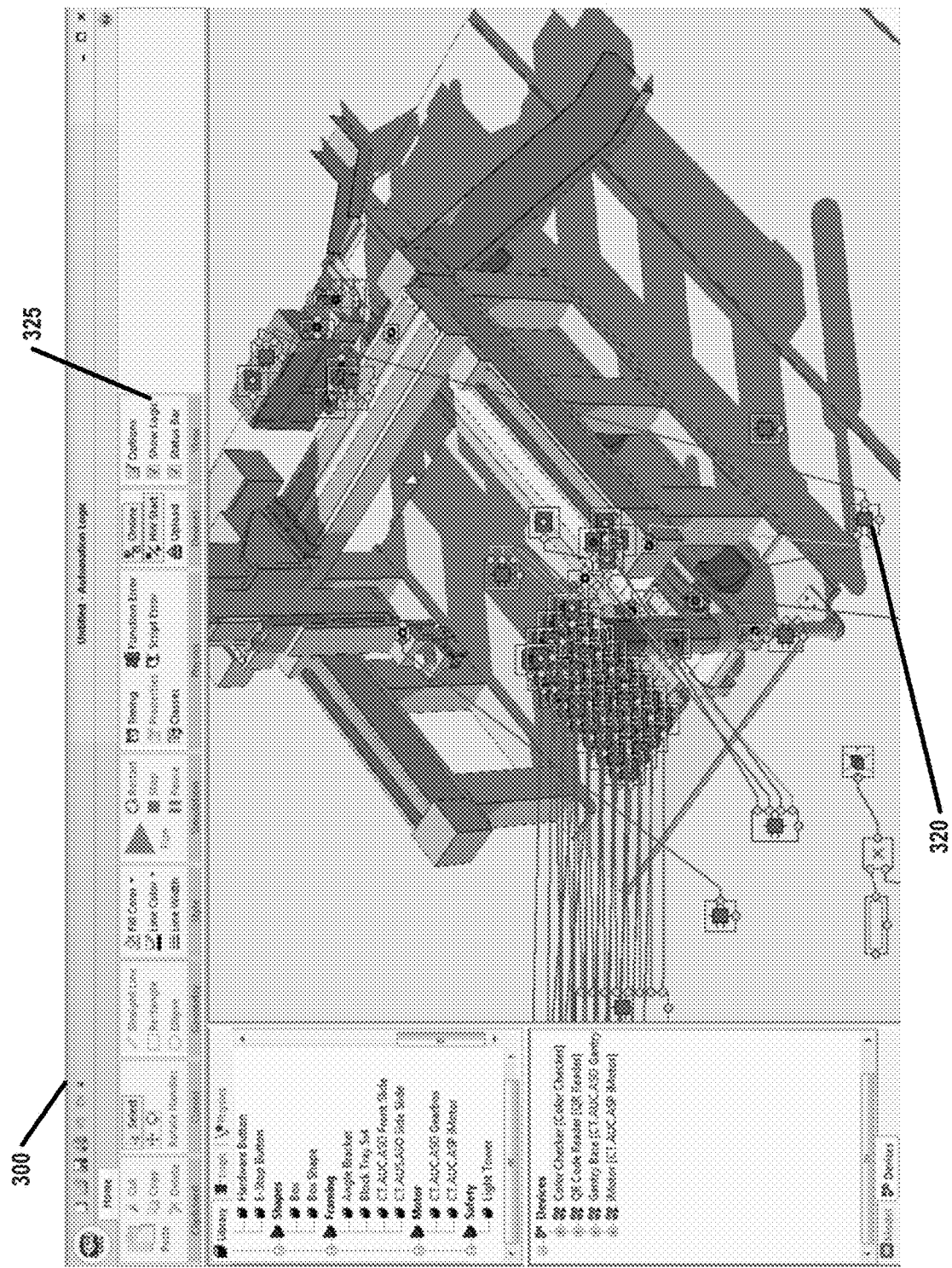
FIG. 3D shows how the graphical user interface appears when application logic is visible.
Figure 3E:
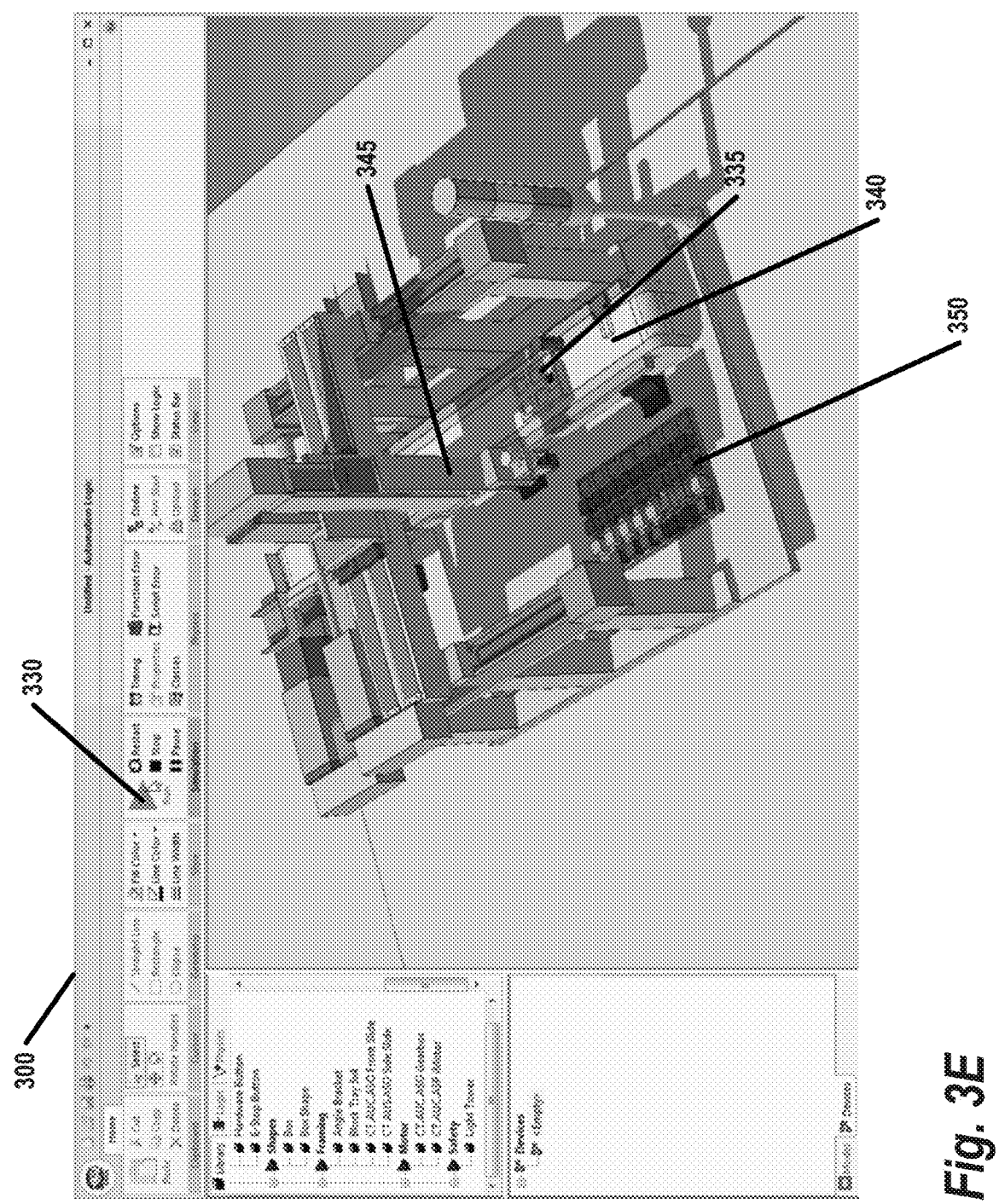
FIG. 3E shows how the application appears in the graphical user interface while in simulation mode.

In some embodiments, the engineering tool will include functions for debugging the application based on the virtual representation of the machine. For example, while the engineering tool is networked to the hardware, the user may inspect the state of the logic and see the values of different properties and constraints. FIG. 3D provides a view of the engineering tool where the user has enabled the display of logic (by checkbox 325) and a graphical representation of the logic is presented in the graphical user interface (e.g., logic block 320). Disconnecting from the hardware, the user can run the application in a simulation mode. FIG. 3E shows how the application appears in the graphical user interface 300 while in simulation mode. The simulation mode can be enabled by activating a run command of the graphical user interface (arrow 330). All aspects of the application's functions can be encoded using the engineering tool including movement of actuators, response to sensors, and production and interaction of work products. For example, the work tray 335 on the conveyor 340 and the gantry 345 picking up blocks 350 operate in the same manner in both the physical and virtual device. The sizes and movements of the virtual devices in the engineering tool may be calibrated to be nearly identical to the real hardware. For example, the position where the tray 335 is stopped underneath the color inspection camera can be the same for both virtual and physical worlds. There may be no sensor there. Thus, the tray 335 could be stopped because it measures out the correct distance. The software would need to get the value right so that the simulated stopping position is equivalent to the physical stopping position.

The engineering tool allows for rapid development and testing of application software that can run on automation system hardware with no modification. Component based design allows the complicated details of the hardware devices to be encapsulated into easy to deploy objects. In some embodiments, these components are reusable objects that are at once hardware devices in an application and software that defines the behavior of the devices. A component can possess 3D geometry, mechanical actuation, logical behavior, and it can possibly be programmed.

Figure 4A:
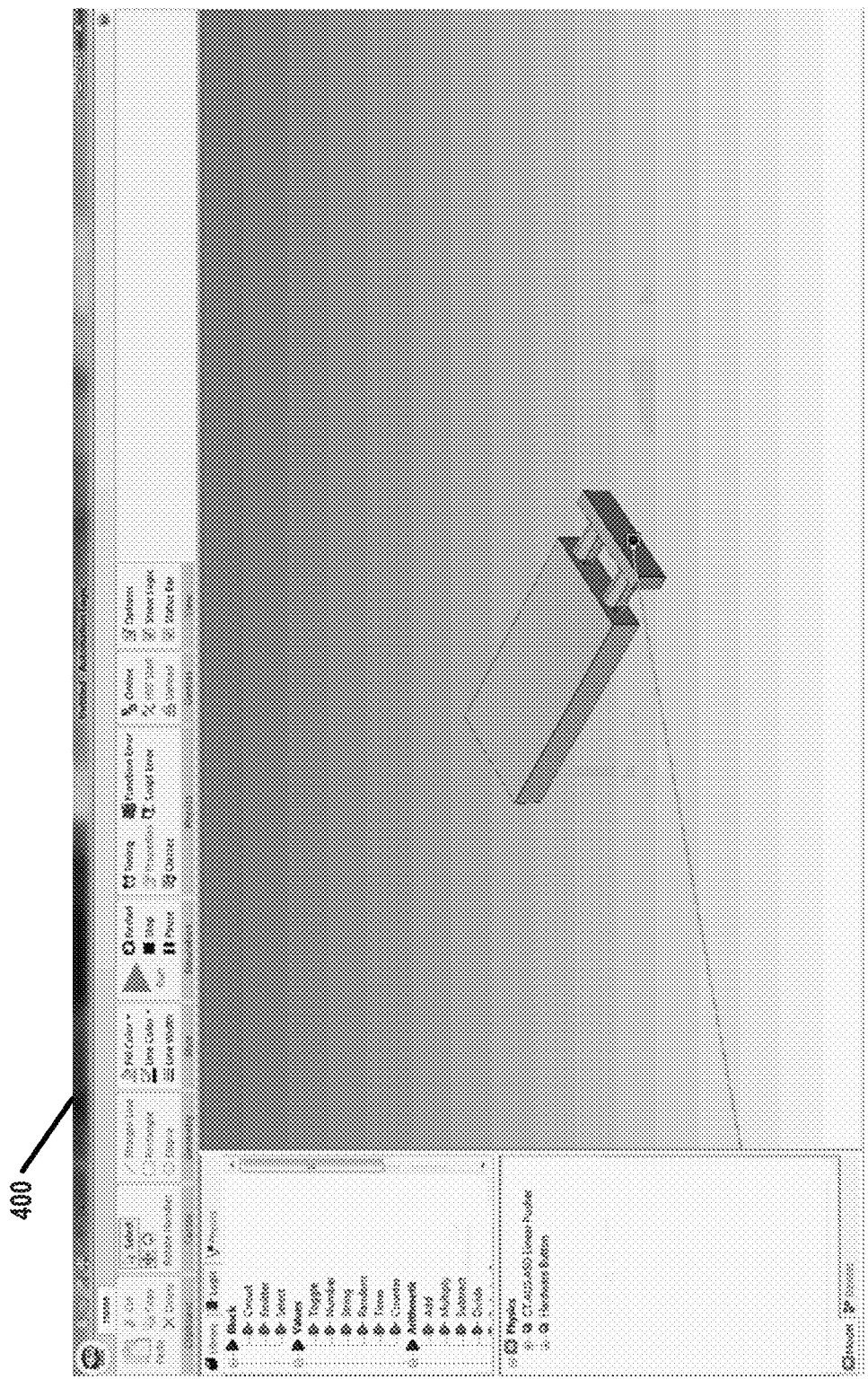
FIG. 4A shows another example of the engineering tool used in some embodiments, with a graphical user interface illustrating a depiction of a linear pusher model.

A supplier can directly encode know-how about the components the supplier sells so that it is available for the user of the component to apply. FIG. 4A shows another example of the engineering tool with a graphical user interface 400 illustrating a depiction of a linear pusher component. Although the linear pusher model could be a relatively simple device, it may be undesirable to have to rebuild its definition from scratch every time one uses it in an application.

FIGS. 4B-4E show a graphical user interface 405 of a component design tool that may be used in some embodiments to design components for use in the engineering tool described above with respect to FIGS. 3A-3E. In some embodiments, the component design tool is part of the engineering tool. For example, there may be a menu item in the engineer tool that, when activated, displays the component design tool. In other embodiments, the component design tool is a completely separate tool from the engineering design tool or it may be an add-on to another software application such as CAD system. In this example, it is assumed that the component design tool is a separate software item that is used by a supplier to design a virtual component which includes the functionality of a related physical device made by the supplier.

Figure 4B:
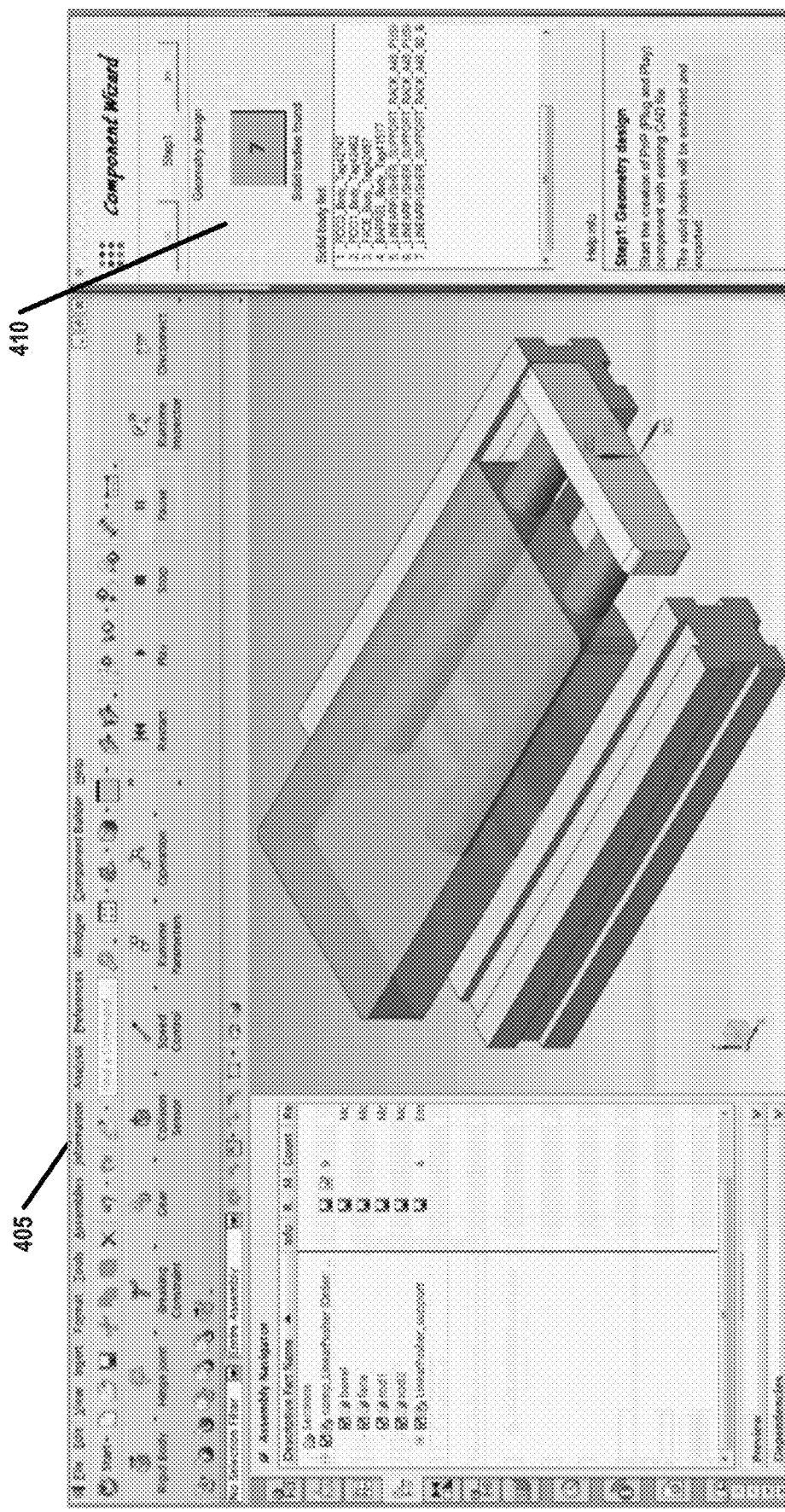
FIG. 4B shows the extracted geometric description of the various components of the device shown in FIG. 4A.
Figure 4C:
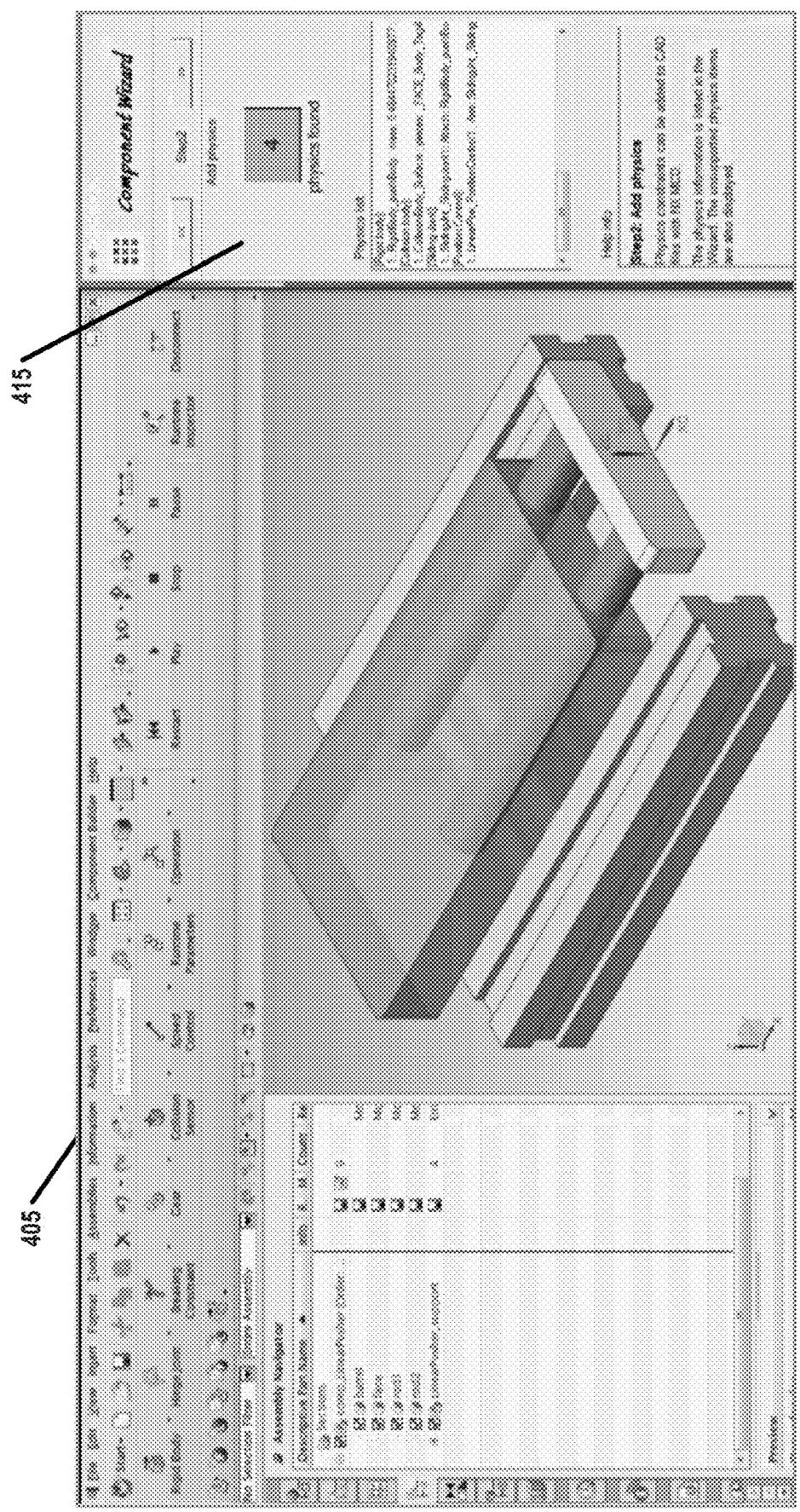
FIG. 4C shows a view of the graphical user interface that allows configuration of the various physics constraints associated with the different physical components in the device shown in FIG. 4A.

As shown in FIGS. 4B and 4C, starting from the CAD and physical kinematics description of the device, the geometry and the simulation properties can be extracted automatically. Specifically, FIG. 4B shows the extracted geometric description of the various components of the device. Portion 410 of the graphical user interface 405 indicates that 7 solid bodies have been identified as being part of the device. Similarly, FIG. 4C shows the various physics kinematic constraints associated with the different simulated elements in the device in portion 415 of the graphical user interface 405.

Figure 4D:
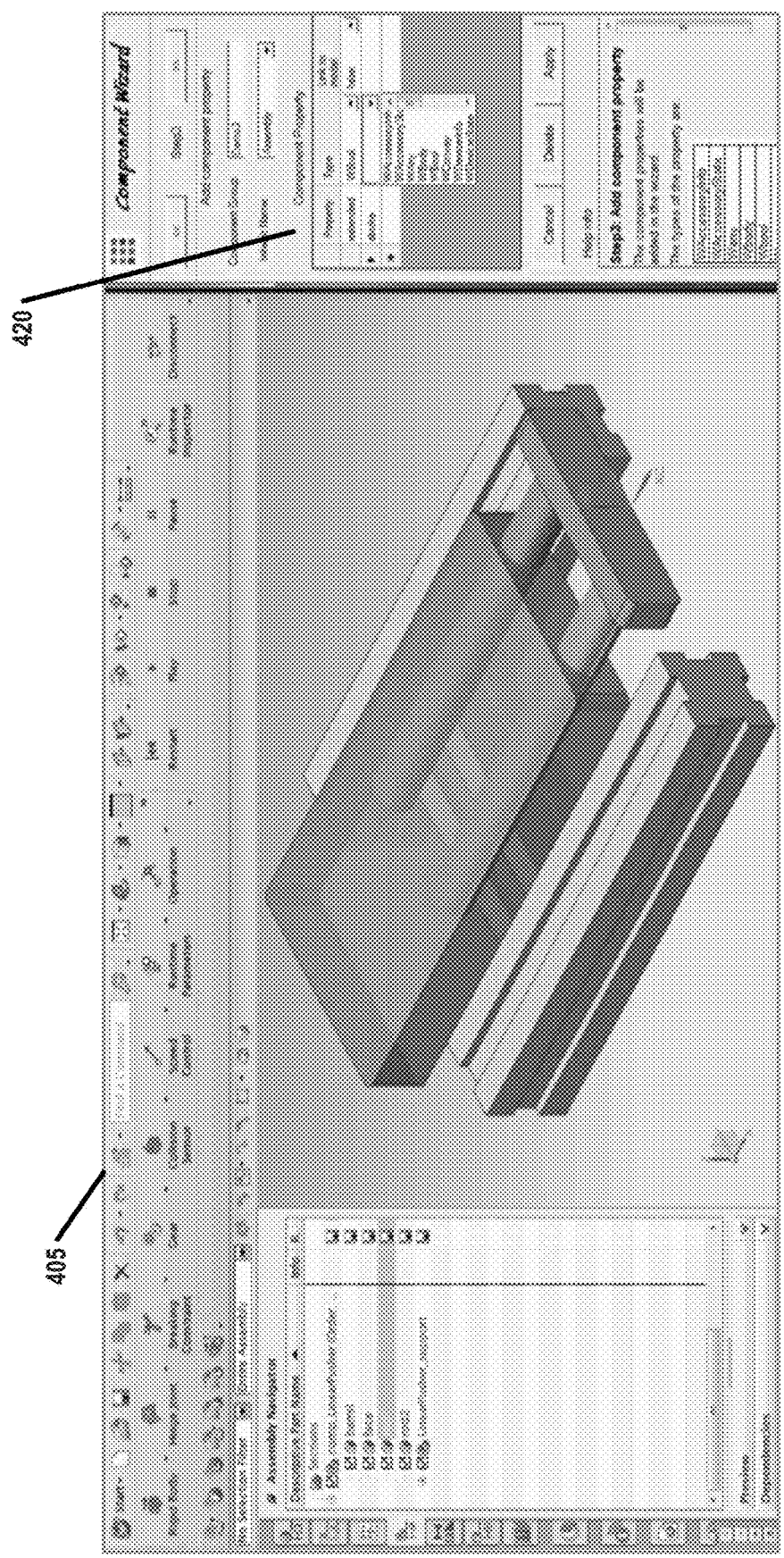
FIG. 4D provides an alternate view of the graphical user interface where a portion of the interface includes graphical components which allow various properties to be created and set by the supplier.
Figure 4E:
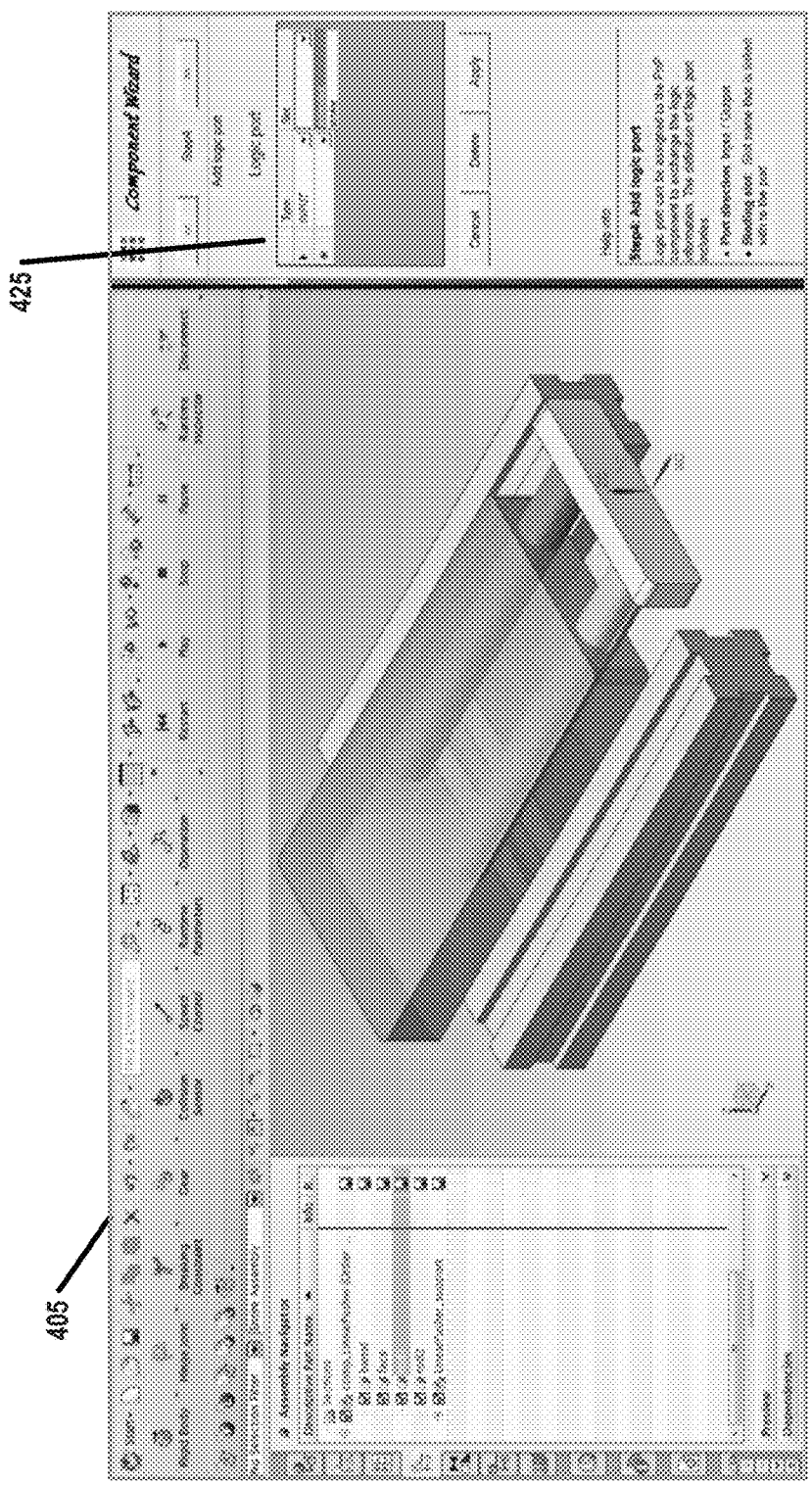
FIG. 4E provides another view of the graphical user interface where a portion of the interface includes graphical components which allow the supplier to add a logic input to the pusher which instructs it when to perform a pushing operation.
Figure 4F:
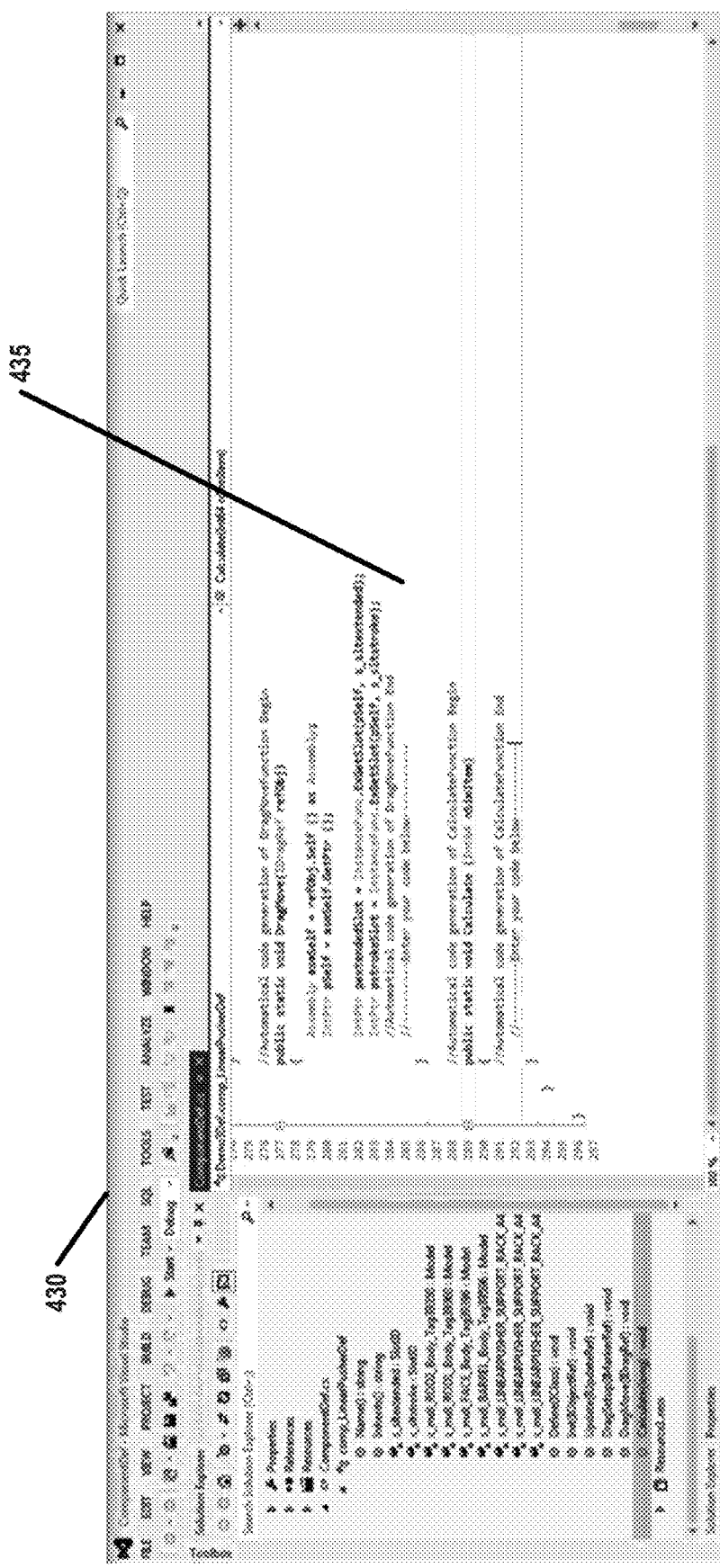
FIG. 4F shows a graphical user interface which allows the supplier to add the source code for making the simulated pusher extend and retract and then compiles it into the component's software.

Once a component's geometric and kinematic design has been extracted into the component design tool, the supplier can then define properties that the user may adjust to tailor the device for the application. FIG. 4D provides an alternate view of the graphical user interface 405 where a portion 420 of the interface includes graphical elements which allow various properties to be added and initialized by the supplier. For a pusher like the one illustrated in this example, the interface may be a length property to describe how long the pusher's arm stroke will be and a Boolean property for whether or not the arm is extended. FIG. 4E provides another view of the graphical user interface 405 where a portion 425 of the interface includes graphical elements which allow the supplier to add a logic input to the pusher which instructs it when to perform a pushing operation. The interface may be used to create both logic inputs and outputs. The logic input and output specification may be used by the engineering tool to create ports for other logical objects to connect to the component when it is instantiated in the engineering tool. FIG. 4F shows a graphical user interface 430 which allows the supplier to add the source code 435 for making the behavior of the simulated pusher extend and retract based on the values of the properties and logic input and then compiles it into the component's software. The component is then available for use in the graphical engineering tool (see, FIGS. 3A-3E). The component may be compiled into a dynamically loaded library that is loaded by the engineering tool when it is deployed. Note that the supplier creates the intrinsic behavior of the component and does not need to make functions for any application-level behavior such as knowing when to push. For example, the pusher might be extended based on when a timer expires. The supplier does not need to encode application behavior into the component because that kind of behavior is programmed by the user.

On the runtime side, the supplier creates a similar component package to handle operations on the controller. The runtime implementation may be given the same property and logic input interface as the component in the engineering tool. For a component like the pusher, the values of the component properties may be tied to hardware Input/Output (I/O) values of the controller. For a component like the gantry shown in FIGS. 3A-3E, the runtime implementation can encapsulate complex functions such as communication across a controller area network (CAN) bus. This runtime behavior may be provided in a runtime dynamic library that is made available in the controller and loaded into the application when it runs. Conversely, for a simple component like the pusher that only has a binary output, a separate dynamically loaded code library may not be required.

Figure 5A:
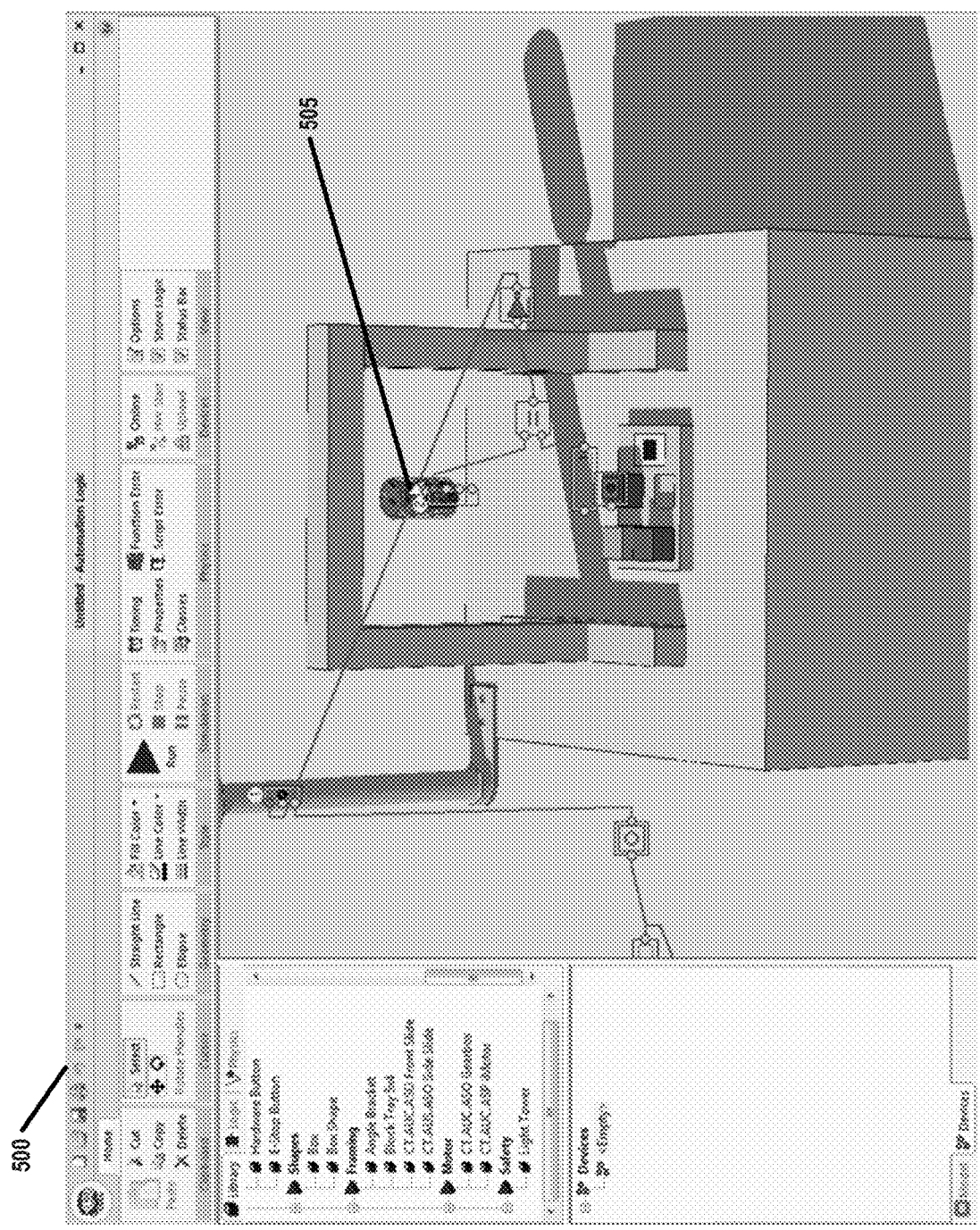
FIG. 5A shows a graphical user interface where a device with a camera component is displayed for configuration by the end user.
Figure 5B:
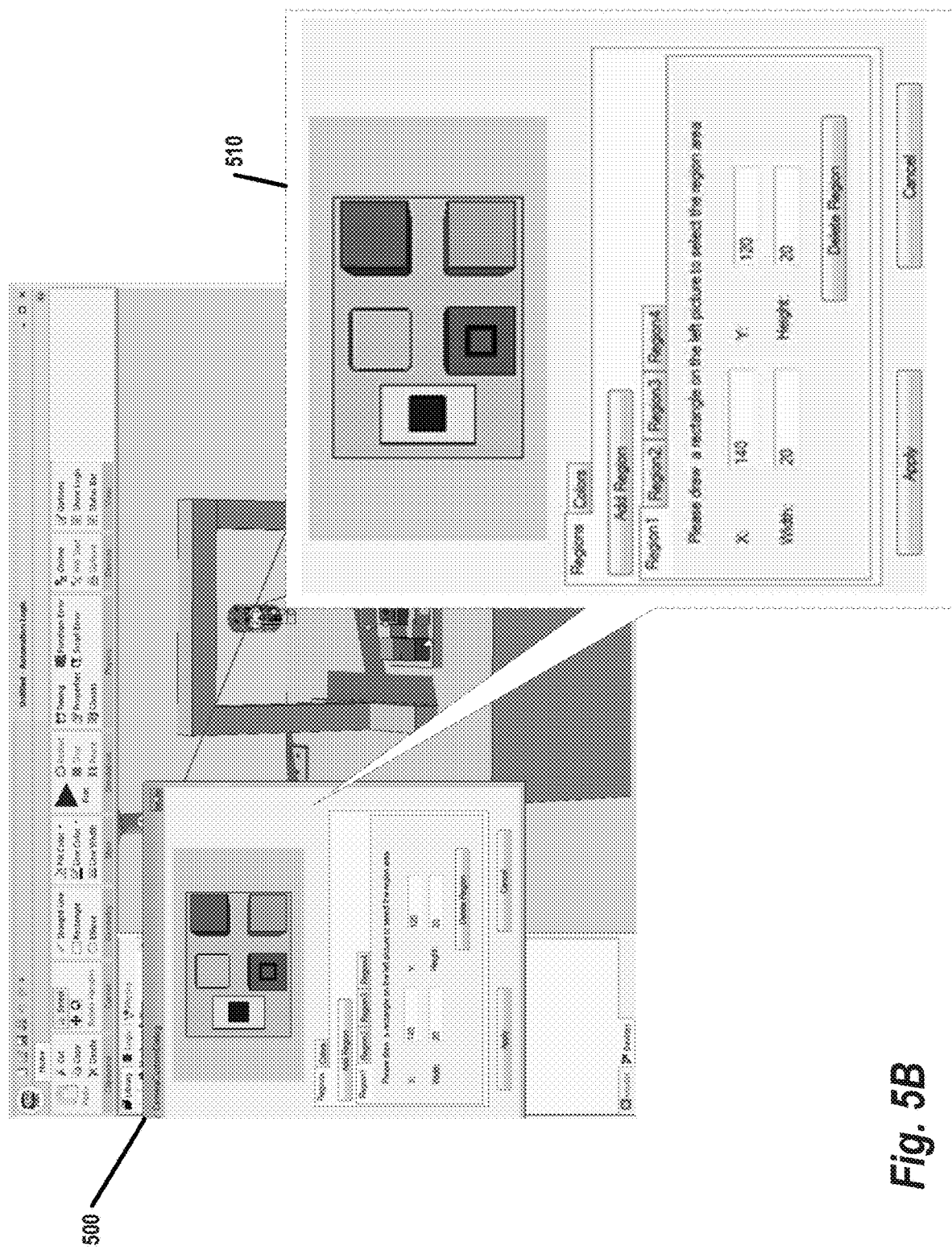
FIG. 5B shows the graphical user interface after the user requests to change the camera configuration.
Figure 5C:
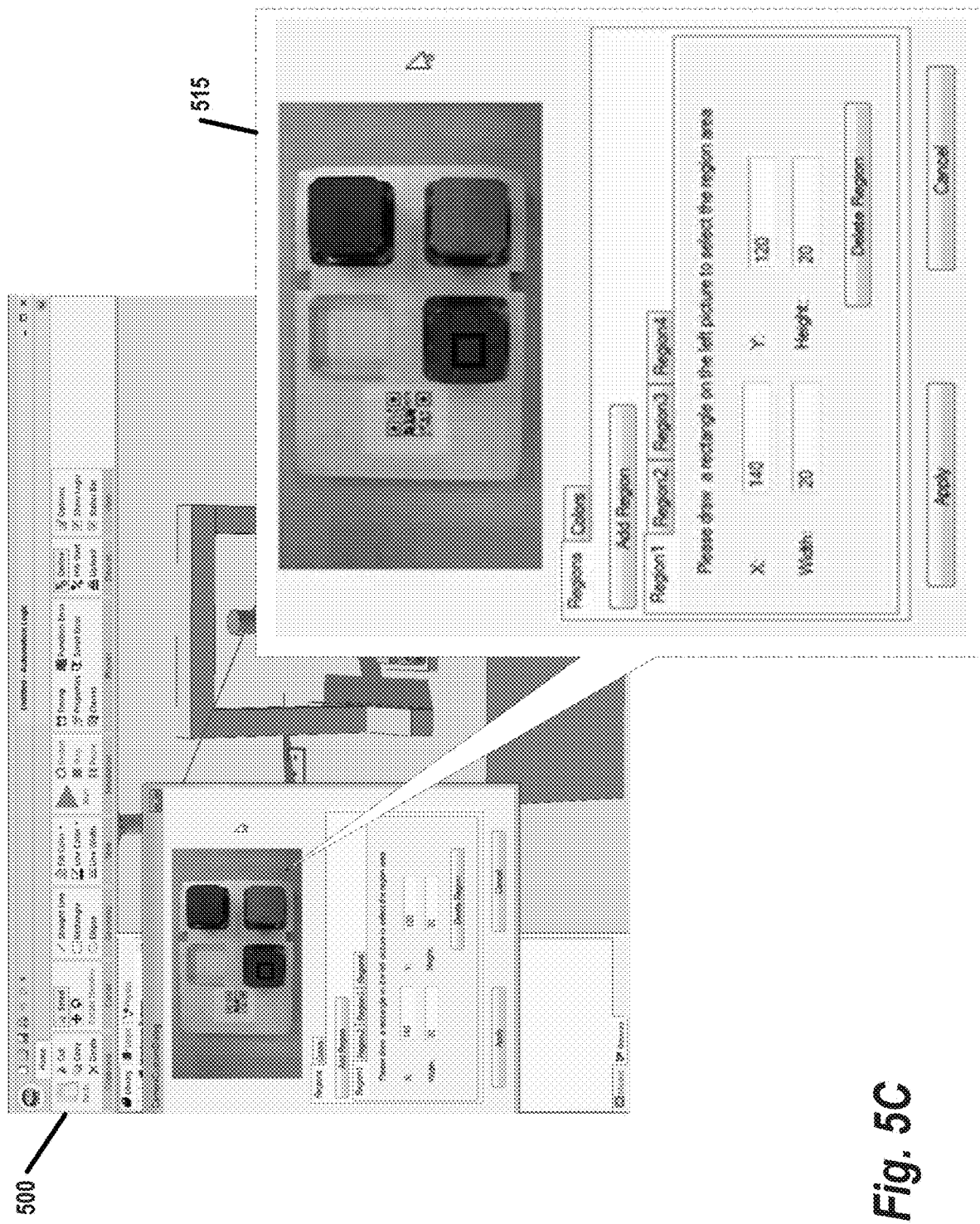
FIG. 5C shows the graphical user interface after the user connects the virtual component to the physical component.

FIGS. 5A-5C provide an illustration of how real world and simulated camera images may be integrated directly into control application development in the engineering tool, according to some embodiments. In the block sorting example described herein, camera components are used that can perform complex vision algorithms for sensing. The camera object need not be built into the engineering tool; rather it can be an imported component just like every other device. In order to take advantage of the 3D virtual world, the camera may request information about the camera's geometry state and the graphical depictions of the 3D objects within its view that allows the camera component to see the real world just as the real camera would. FIG. 5A shows a graphical user interface 500 where a device with a camera component 505 is displayed for configuration by the end user.

FIG. 5B shows the graphical user interface 500 after the user requests to change the camera configuration. A camera component may be supplied with a custom dialog that is specific to the configuration and behavior of the camera may be viewed, produced, and managed. The custom dialog may accompany the component implementation in the dynamically loaded library for that component. The enlarged portion of the graphical user interface 500 presented in callout 510 shows a dialog box which allows the user to mark the active locations where the camera can detect objects. Thus, using this interface, the slots in the tray can be marked where blocks are placed so that the camera can detect the block's color. In general, different kinds of components could be configured differently depending on their function. In this example, the camera is used to detect the color of certain regions in its visual field. Other camera-like devices might detect shapes or faces or other entities.

FIG. 5C shows the graphical user interface 500 after the user connects the virtual component to the physical component such as by activating the networking feature of the engineering tool. Based on this connection, real-time images can be displayed directly in the engineering tool. Thus, the dialog box shown in the callout 515 presents a real time picture coming from the physical camera. This image may be used, for example, to train the camera to find the correct colors. The functions of the component dialog may support component-specific features without requiring direct support from the engineering tool.

In some embodiments, the engineering tool provides logic blocks referred to herein as tag and tag sensors for integrating the engineering tool's programming and simulation language with the simulated components. These logic blocks may be used in conjunction with other logic blocks defined in the engineering tool such as ones for representing numerical values, arithmetic, selection, comparison, and other logical operations. The term tag, as used herein, refers to a label associated with a simulated object to set one or more properties. The value associated with the label is referred to herein as the "tag value." Examples of properties that may be set with tags include, without limitation, color, orientation, and shape of a component. Tags may also contain numerical, Boolean, string, or other properties. The basic function of a tag sensor is that it can detect when a tag is nearby. The position of a tag may be determined by the geometric location of the tag relative to the object to which it is attached. In some embodiments, a tag sensor can also be set to detect tags in an infinite range, in which case, tags can be used to transfer tag values between logic without intervening links. Tags may also be set to active or inactive so that different tags may be detected depending on which are active. A tag sensor may provide values of the properties of the tags it detects. For example, a tag sensor may provide the geometric location and orientation of the detected tag. A tag sensor may also detect multiple tags simultaneously. In some embodiments, a tag sensor may provide a list of values for all tags that are within its range. It is also possible that a tag sensor may be used to count tags or form a sorted or unsorted list of tags that match a given criteria.

Programming with tags is especially powerful. The position of the tag in the simulation can act as data with the program and cause events to trigger. For example, putting a tag on a moving arm can be used to track a particular position on that arm without having to compute the position based on summing the angles of the articulations of the arm. A set of tags that are generated (like with the emitter) can be used to mark objects such as work pieces. As another example, tags may be generated by a vision system to mark the objects the vision system recognizes. Tag sensors act on the tags and the positions of the tags in the virtual world.

Tags can be attached to components that are tied to real world objects (e.g., blocks); thus, the engineering tool would be able to represent the position of these objects within the virtual environment accurately. For static objects, the position would remain constant, so there is little issue. For a moving object, the object may be permanent or dynamically generated. A moving object's position is determined by its kinematics. Various aspects of object may be partially simulated at runtime, including its kinematic position. To perform this simulation, in some embodiments, the engineering tool creates a hierarchical tree of reference frames to describe the position of the tag with respect to known parameters of the moving objects. For objects whose position is determined by simulated physical constraints, the component may supply a function to calculate the proper position based on its internal state. Additionally, in some embodiments, the user might also provide simulation constraints to calculate positions for difficult cases.

Calculating the position of a tag on a dynamic object depends on how the dynamic object is being generated. In general, a dynamic object is part of the simulation and is not available at runtime. A tag attached to the simulated object would also not be around at runtime. So, a sensor for detecting positions of a simulated tag would not generate values at runtime unless the tag is generated in a detectable way. A dynamically generated tag can be detected at runtime if it is generated by an object at runtime such as a sensor. A camera, for example, can potentially be used to detect a multitude of work pieces at a wide range of locations. The internal runtime representation for the camera results may be a dynamic list of positions indicating the geometry of the detected work pieces. In some embodiments of the engineering tool, this is achieved with dynamically generating the identifying tags that had been associated with the objects during simulation. In this case, the camera object may be responsible for generating the internal, virtual work piece objects with tags based on the calculated positions of the real objects. The camera object may also generate the tag object without the work piece as long as the position of the tag reflects the position that it would take when attached to the work piece. A work piece generated with multiple tags in simulation would likewise need the sensor to generate all associated tags for the sensed object. The system can track the position of associated tags based on the tag the sensor generates and positions. The sensor may be responsible for updating position and other related information that it senses with the object and assign it to the correct tag. The sensor may also potentially create new tags for every time it updates its sensor values. The tag sensors would then retrieve the information provided by the tags generated by the component sensor and apply it to other factors in the runtime. Thus, by supplying information provided through tags, the vision algorithms executed by the physical sensor can be used within the application to compute automation behavior. In turn, this allows the automation program to provide a more true-to-life representation of the operation of the physical environment. Moreover, this allows an implementation of vision algorithm to be ported directly from the simulation environment to the physical environment or vice versa.

Figure 6A:
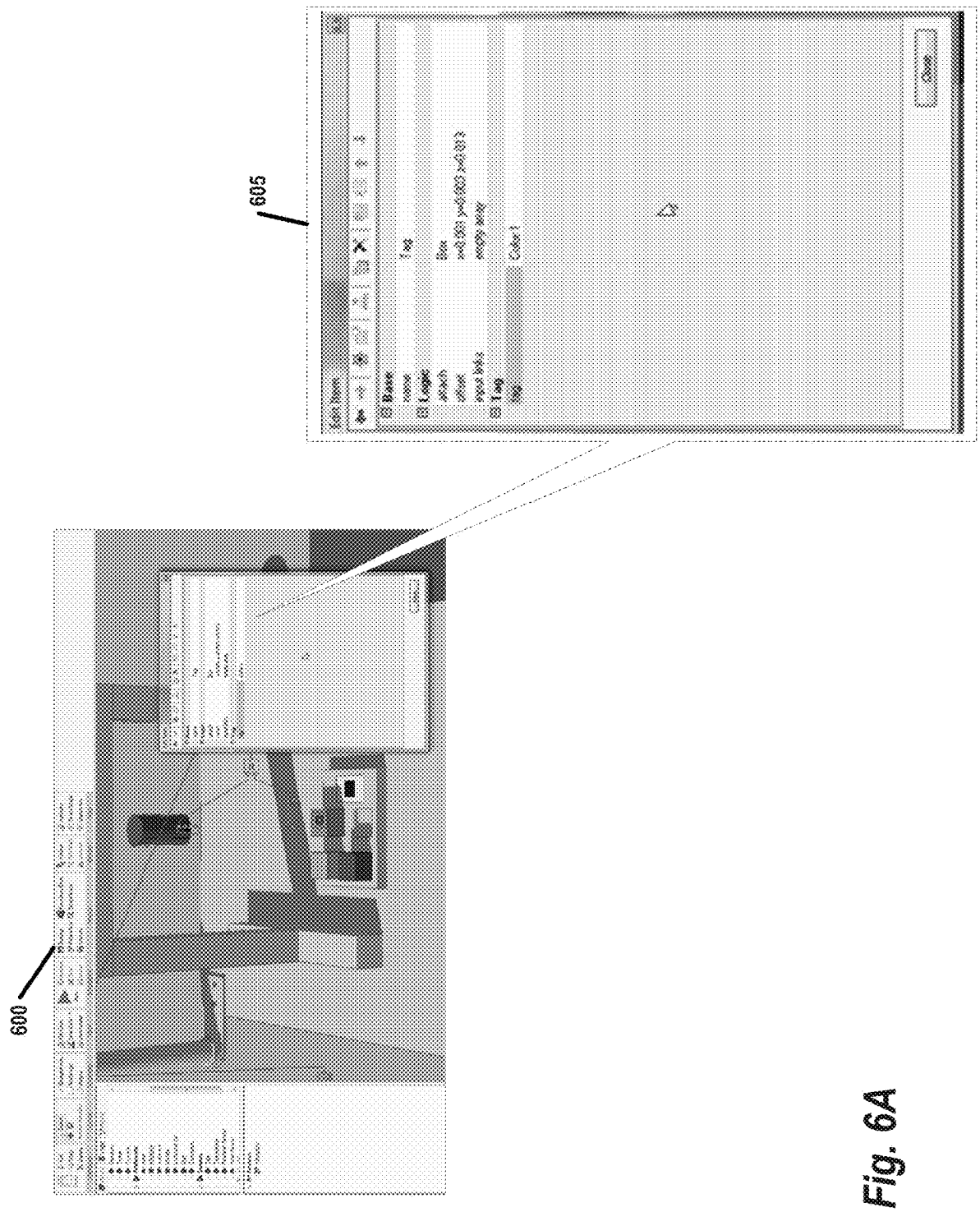
FIG. 6A provides an illustration of how the graphical user interface of the engineering tool may be adapted to receive tag information.
Figure 6B:
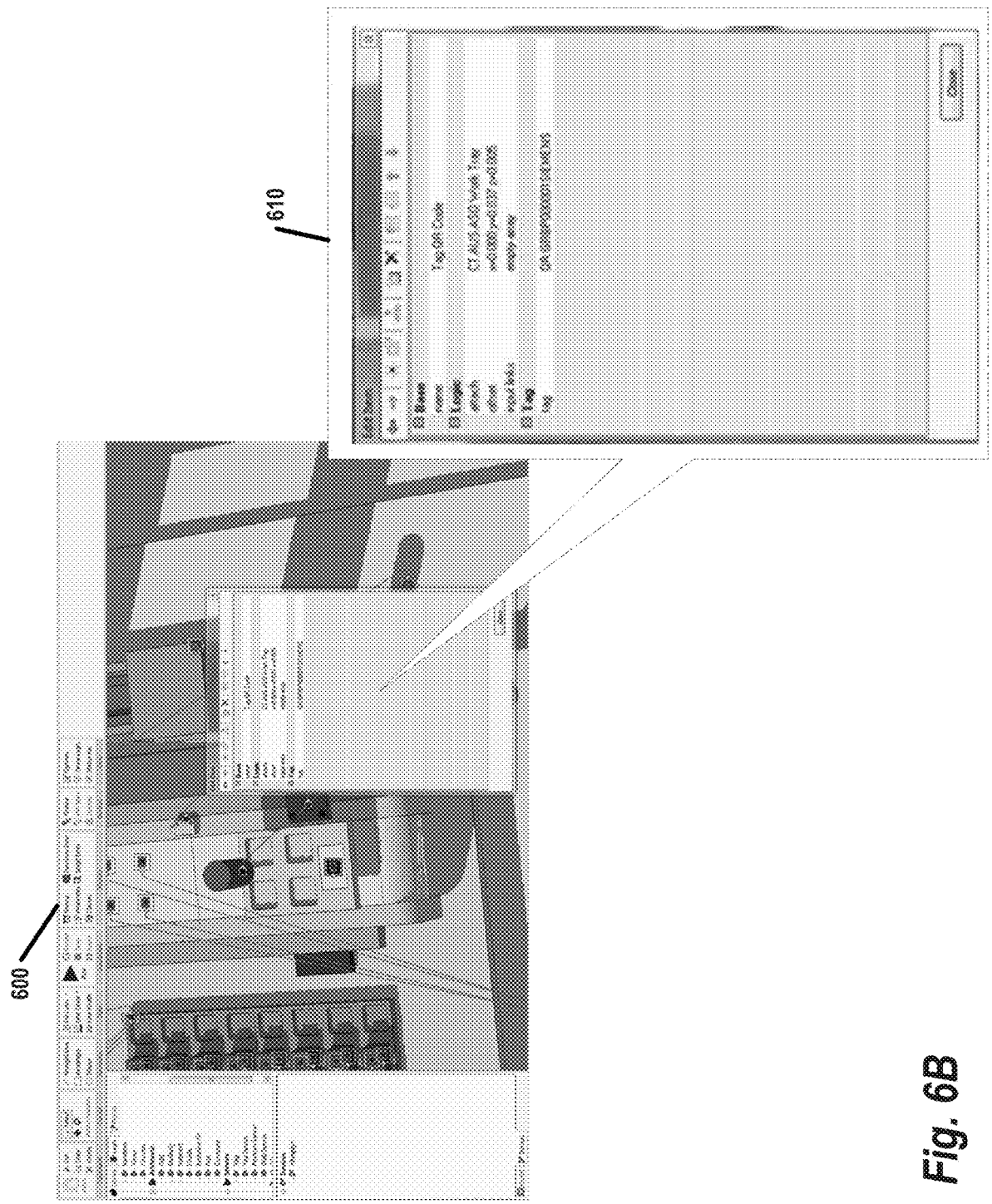
FIG. 6B shows another example of the graphical user interface of the engineering tool where a dialog box is used to supply the QR code for a tray running through the system.

FIG. 6A provides an illustration of how the graphical user interface 600 of the engineering tool may be adapted to receive tag information. Here, a dialog box (enlarged in callout 605) provides fields specifying the name, logic, and tag information. The user has specified that the tag should be set to "Color: 1." This may be used, for example, as the tag for all red blocks. Using the information in the tag, the camera's visual sensing may be simulated. For example, if the camera is looking for blocks of a particular color, it can request the identifier for all tags in the region corresponding to the camera's viewing frustum where it is looking and find the intersecting tag that describes the desired color. The same technique can be used to mark other relevant visual information with the value of its pattern without having to do real vision processing in simulation mode. For example, FIG. 6B shows another example of the graphical user interface 600 of the engineering tool where a dialog box (enlarged in callout) is used to supply the QR code for a tray running through the system. In this case, the string may provide the value that would normally be encoded in the arrangement of squares in the QR code.

It should be noted that the general principles discussed above may be extended to simulate the behavior of any physical sensor. For example, while FIGS. 6A and 6B describe embodiments where the physical sensor may be a color checking component or a QR reader, respectively, the process of setting tag values and simulating behavior may be applied to any visually detectable or proximity-based property of the components of the simulation environment. Moreover, in some embodiments, non-visual properties of devices (e.g., temperature, pressure, flow, etc.) may be similarly simulated by the engineering tool using tags as discussed herein. Also, in some embodiments, external values such as coming from an external database or communication with an external processing unit may be simulated with tags and produced at runtime by generating tags dynamically.

Figure 7:
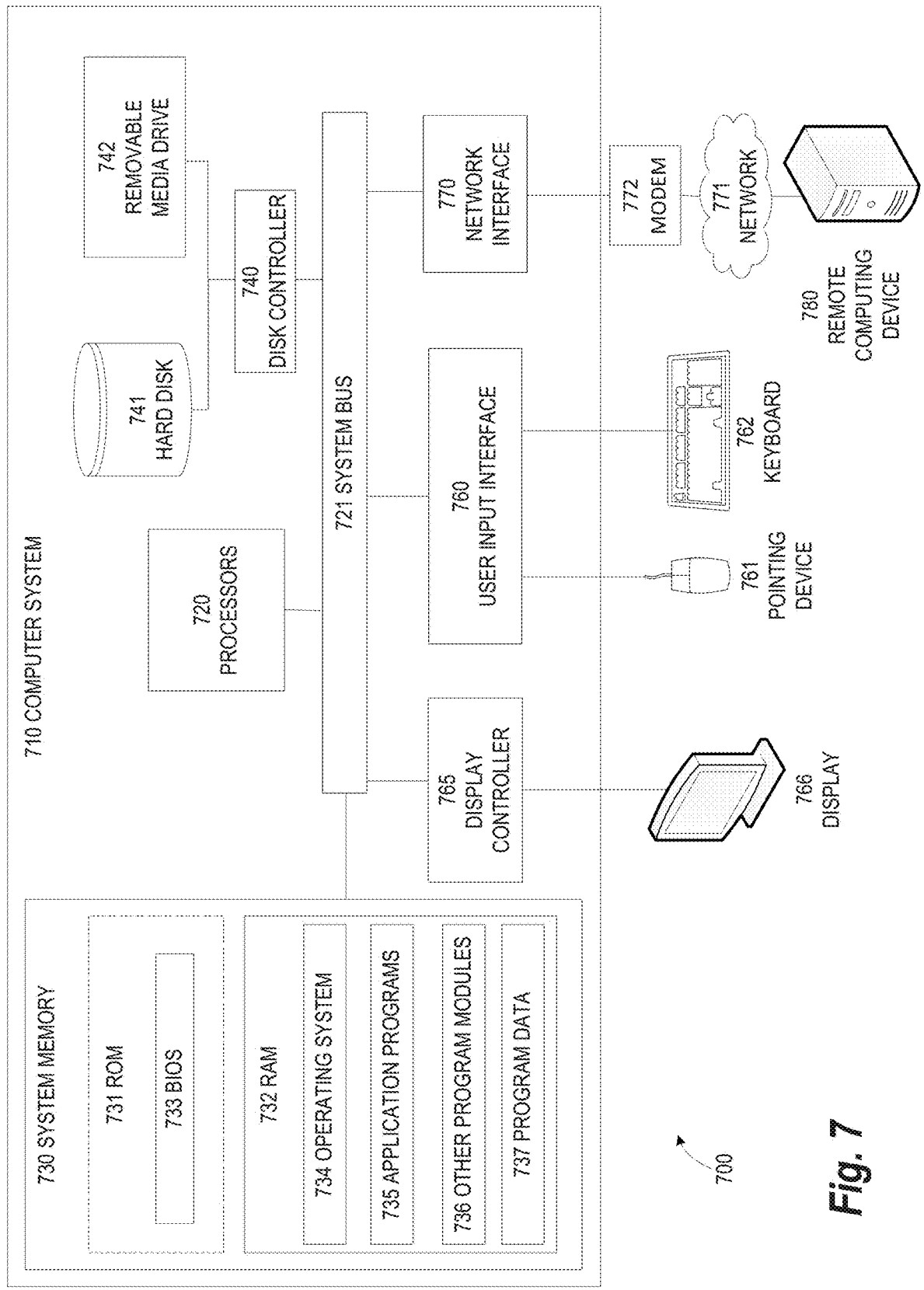
FIG. 7 illustrates an exemplary computing environment within which embodiments of the invention may be implemented.

FIG. 7 illustrates an exemplary computing environment 700 within which embodiments of the invention may be implemented. For example, computing environment 700 may be used to implement one or more components of the simulation environment 100 shown in FIG. 1. Computers and computing environments, such as computer system 710 and computing environment 700, are known to those of skill in the art and thus are described briefly here.

As shown in FIG. 7, the computer system 710 may include a communication mechanism such as a system bus 721 or other communication mechanism for communicating information within the computer system 710. The computer system 710 further includes one or more processors 720 coupled with the system bus 721 for processing the information.

The processors 720 may include one or more central processing units (CPUs), graphical processing units (GPUs), or any other processor known in the art. More generally, a processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and be conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

Continuing with reference to FIG. 7, the computer system 710 also includes a system memory 730 coupled to the system bus 721 for storing information and instructions to be executed by processors 720. The system memory 730 may include computer readable storage media in the form of volatile and/or nonvolatile memory, such as read only memory (ROM) 731 and/or random access memory (RAM) 732. The system memory RAM 732 may include other dynamic storage device(s) (e.g., dynamic RAM, static RAM, and synchronous DRAM). The system memory ROM 731 may include other static storage device(s) (e.g., programmable ROM, erasable PROM, and electrically erasable PROM). In addition, the system memory 730 may be used for storing temporary variables or other intermediate information during the execution of instructions by the processors 720. A basic input/output system 733 (BIOS) containing the basic routines that help to transfer information between elements within computer system 710, such as during start-up, may be stored in system memory ROM 731. System memory RAM 732 may contain data and/or program modules that are immediately accessible to and/or presently being operated on by the processors 720. System memory 730 may additionally include, for example, operating system 734, application programs 735, other program modules 736 and program data 737.

The computer system 710 also includes a disk controller 740 coupled to the system bus 721 to control one or more storage devices for storing information and instructions, such as a magnetic hard disk 741 and a removable media drive 742 (e.g., floppy disk drive, compact disc drive, tape drive, and/or solid state drive). The storage devices may be added to the computer system 710 using an appropriate device interface (e.g., a small computer system interface (SCSI), integrated device electronics (IDE), Universal Serial Bus (USB), or FireWire).

The computer system 710 may also include a display controller 765 coupled to the system bus 721 to control a display 766, such as a cathode ray tube (CRT) or liquid crystal display (LCD), for displaying information to a computer user. The computer system includes an input interface 760 and one or more input devices, such as a keyboard 762 and a pointing device 761, for interacting with a computer user and providing information to the one or more processors 720. The pointing device 761, for example, may be a mouse, a light pen, a trackball, or a pointing stick for communicating direction information and command selections to the one or more processors 720 and for controlling cursor movement on the display 766. The display 766 may provide a touch screen interface which allows input to supplement or replace the communication of direction information and command selections by the pointing device 761.

The computer system 710 may perform a portion or all of the processing steps of embodiments of the invention in response to the one or more processors 720 executing one or more sequences of one or more instructions contained in a memory, such as the system memory 730. Such instructions may be read into the system memory 730 from another computer readable medium, such as a magnetic hard disk 741 or a removable media drive 742. The magnetic hard disk 741 may contain one or more datastores and data files used by embodiments of the present invention. Datastore contents and data files may be encrypted to improve security. The processors 720 may also be employed in a multi-processing arrangement to execute the one or more sequences of instructions contained in system memory 730. In alternative embodiments, hard-wired circuitry may be used in place of or in combination with software instructions. Thus, embodiments are not limited to any specific combination of hardware circuitry and software.

As stated above, the computer system 710 may include at least one computer readable medium or memory for holding instructions programmed according to embodiments of the invention and for containing data structures, tables, records, or other data described herein. The term "computer readable medium" as used herein refers to any medium that participates in providing instructions to the one or more processors 720 for execution. A computer readable medium may take many forms including, but not limited to, non-transitory, non-volatile media, volatile media, and transmission media. Non-limiting examples of non-volatile media include optical disks, solid state drives, magnetic disks, and magneto-optical disks, such as magnetic hard disk 741 or removable media drive 742. Non-limiting examples of volatile media include dynamic memory, such as system memory 730. Non-limiting examples of transmission media include coaxial cables, copper wire, and fiber optics, including the wires that make up the system bus 721. Transmission media may also take the form of acoustic or light waves, such as those generated during radio wave and infrared data communications.

The computing environment 700 may further include the computer system 710 operating in a networked environment using logical connections to one or more remote computers, such as remote computer 780. Remote computer 780 may be a personal computer (laptop or desktop), a mobile device, a server, a router, a network PC, a peer device or other common network node, and typically includes many or all of the elements described above relative to computer system 710. When used in a networking environment, computer system 710 may include modem 772 for establishing communications over a network 771, such as the Internet. Modem 772 may be connected to system bus 721 via user network interface 770, or via another appropriate mechanism.

Network 771 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 710 and other computers (e.g., remote computing 780). The network 771 may be wired, wireless or a combination thereof. Wired connections may be implemented using Ethernet, Universal Serial Bus (USB), RJ-6, or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 771.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically, wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

I claim:

1. A computer-implemented method of simulating automation applications based on input from a user, the method comprising:
    creating, by a computer, a system design in a three-dimensional workspace based on one or more instructions provided by the user, wherein the system design comprises:
        a sensor component representative of a physical sensor controlled by a physical controller, and
        one or more detectable components representative of objects detectable by the physical sensor;
    placing a tag on at least one of the detectable components, the tag configured to track a particular position of the at least one detectable component;
    assigning, by the computer, one or more tag values associated with the tag;
    executing, by the computer, a simulation of the system design in response to a command from the user, wherein the sensor component simulates detection of the at least one detectable component by identifying a particular tag value of the one or more tag values associated with the tag of the at least one detectable component, so as to track the particular position of the at least one detectable component without the physical sensor detecting data concerning the particular position;
    generating executable code for the physical controller to control the physical sensor based on the simulation using the tag values; and
    transferring the generated executable code from the simulation to the physical controller.

2. The method of claim 1, the method further comprising:
    placing another tag on another one of the detectable components, the tag configured to identify a visually detectable property of the other detectable component.

3. The method of claim 2, wherein the visually detectable property is a color value.

4. The method of claim 2, wherein the visually detectable property is a barcode value.

5. The method of claim 1, wherein tag values assigned to each of the one or more detectable components during the execution of the simulation of the system design using a dynamically generated tag object.

6. The method of claim 1, further comprising:
    prior to executing the simulation of the system design, performing a calibration process comprising:
        presenting a sensor input interface comprising a sensor image showing a field of view of the sensor component, and
        receiving, via the sensor input interface, one or more user-specified locations within the field of view, and
        configuring the sensor component to detect the one or more detectable components when located at the one or more user-specified locations.

7. The method of claim 6, further comprising:
    receiving a real-time video stream from the physical sensor,
    wherein the sensor image in the sensor input interface comprises the real-time video stream.

8. The method of claim 6, further comprising:
    during execution of the simulation of the system design, identifying a first detectable component at one of the one or more user-specified locations; and
    identifying a first tag value associated with the first detectable component; and
    using the first tag value to simulate detection of the first detectable component.

9. A system for designing automation applications based on input from a user, the system comprising:
    a computer created workspace configured to allow user creation and manipulation of a three-dimensional model of an industrial environment, the three-dimensional model comprising:
        a computer created sensor component stored in a computer memory in communication with a computer processor, the sensor component representative of a physical sensor controlled by a physical controller in the industrial environment, one or more computer created detectable components stored in a computer memory in communication with the computer processor, the one or more detectable components representative of physical objects detectable by the physical sensor in the industrial environment, a tag associated with each of the one or more computer created detectable components, the tag of at least one of the detectable components configured to track a particular position of the at least one detectable component; and one or more tag values assigned to the tag;

the system configured to:

generate simulation code that uses the sensor component and the one or more tag values assigned to the tag of the at least one detectable component by identifying a particular tag value of the one or more tag values, so as to track the particular position of the at least one detectable component without the physical sensor detecting data concerning the particular position, thereby simulating detection of the physical objects by the physical sensor, execute the simulation code in response to a command from the user;

generate executable code for the physical controller to control the physical sensor based on the execution of the simulation code using the tag values; and transfer the generated executable code from the execution of the simulation code to the physical controller.

10. The system of claim 9, wherein the system is further configured to send the controller-executable code to the physical controller using a network interface.

11. The system of claim 9, wherein the workspace is further configured to perform a calibration process prior to executing the simulation code, wherein the calibration process comprises:

presenting a sensor input interface comprising a sensor image showing a field of view of the sensor component, receiving, via the sensor input interface, one or more user-specified locations within the field of view, and configuring the sensor component to detect the one or more detectable components when located at the one or more user-specified locations.

12. The system of claim 11, further comprising:

receiving a real-time video stream from the physical sensor using the network interface, wherein the sensor image in the sensor input interface comprises the real-time video stream.

13. The system of claim 11, further comprising:

during execution of the simulation code, identifying a first detectable component at one of the one or more user-specified locations; and identifying a first tag value associated with the first detectable component; and using the first tag value to simulate detection of the first detectable component.

14. The system of claim 9, wherein the physical sensor comprises a color checking device.

15. The system of claim 9, wherein the physical sensor comprises a QR code reader.

16. An article of manufacture for simulating automation applications based on input from a user, the article of manufacture comprising a non-transitory, tangible computer-readable medium holding computer-executable instructions for performing a method comprising:

creating a system design in a three-dimensional workspace based on one or more instructions provided by the user, wherein the system design comprises:

a sensor component representative of a physical sensor controlled by a physical controller, and one or more detectable components representative of objects detectable by the physical sensor;

placing a tag on at least one of the detectable components, the tag configured to track a particular position of the at least one detectable component;

assigning one or more tag values to the tag associated with the at least one detectable component, the one or more tag values indicative of a particular position of the at least one detectable component; and executing a simulation of the system design in response to a command from the user, wherein the sensor component simulates detection of the at least one detectable component by identifying a particular tag value of the one or more tag values associated with the tag of the at least one detectable component, so as to track the particular position of the at least one detectable component without the physical sensor detecting data concerning the particular position.

17. The article of manufacture of claim 16, wherein the method further comprises:

prior to executing the simulation of the system design, performing a calibration process comprising:

presenting a sensor input interface comprising a sensor image showing a field of view of the sensor component, and receiving, via the sensor input interface, one or more user-specified locations within the field of view, and configuring the sensor component to detect the one or more detectable components when located at the one or more user-specified locations.

18. The article of manufacture of claim 17, wherein the method further comprises:

during execution of the simulation of the system design, identifying a first detectable component at one of the one or more user-specified locations; and identifying a first tag value associated with the first detectable component; and using the first tag value to simulate detection of the first detectable component.

* * * * *